US009425122B2

(12) United States Patent
Kawakita et al.

(10) Patent No.: US 9,425,122 B2
(45) Date of Patent: Aug. 23, 2016

(54) ELECTRONIC COMPONENT PACKAGE AND METHOD FOR MANUFACTURING THE SAME

(71) Applicant: Panasonic Intellectual Property Management Co., Ltd., Osaka (JP)

(72) Inventors: Koji Kawakita, Nara (JP); Seiichi Nakatani, Osaka (JP); Susumu Sawada, Osaka (JP); Yoshihisa Yamashita, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/422,505

(22) PCT Filed: Dec. 20, 2013

(86) PCT No.: PCT/JP2013/007501
§ 371 (c)(1),
(2) Date: Feb. 19, 2015

(87) PCT Pub. No.: WO2014/097641
PCT Pub. Date: Jun. 26, 2014

(65) Prior Publication Data
US 2015/0214129 A1    Jul. 30, 2015

(30) Foreign Application Priority Data

Dec. 21, 2012  (JP) ................................ 2012-279842

(51) Int. Cl.
*H01L 33/00* (2010.01)
*H01L 23/367* (2006.01)
(Continued)

(52) U.S. Cl.
CPC .......... *H01L 23/367* (2013.01); *H01L 21/4846* (2013.01); *H01L 21/4871* (2013.01);
(Continued)

(58) Field of Classification Search
CPC .............. H01L 23/367; H01L 21/4846; H01L 21/4871; H01L 21/56; H01L 21/561; H01L 23/3107; H01L 23/3135; H01L 23/36; H01L 23/5389; H01L 24/97; H01L 33/507; H01L 33/52; H01L 33/62; H01L 33/64; H01L 23/49575
USPC .......................................................... 257/98
See application file for complete search history.

(56) References Cited

U.S. PATENT DOCUMENTS 4,835,067 A    5/1989  Levine
4,889,584 A    12/1989 Wada et al.
(Continued)

FOREIGN PATENT DOCUMENTS

JP    1-98237      4/1989
JP    5-121615     5/1993
(Continued)

OTHER PUBLICATIONS

English translation of the International Preliminary Report on Patentability issued Jun. 23, 2015 in International (PCT) Application No. PCT/JP2013/007501.
(Continued)

*Primary Examiner* — Tod T Van Roy
*Assistant Examiner* — Vu A Vu
(74) *Attorney, Agent, or Firm* — Wenderoth, Lind & Ponack, L.L.P.

(57) ABSTRACT

A method for manufacturing an electronic component packages is provided, wherein a package precursor is provided, in which an electronic component is embedded in a sealing resin layer such that an electrode of the electronic component is exposed at a surface of the sealing resin layer. A combination of a formation process of a plurality of metal plating layers and a patterning process of the plurality of metal plating layers is provided to form a step-like metal plating layer, the formation process being performed by sequential dry and wet plating processes with respect to the package precursor, and the patterning process being performed by a patterning of at least two of the plurality of metal plating layers.

31 Claims, 13 Drawing Sheets

(51) Int. Cl.

| | | |
|---|---|---|
| *H01L 33/62* | (2010.01) | |
| *H01L 33/64* | (2010.01) | |
| *H01L 33/52* | (2010.01) | |
| *H01L 23/00* | (2006.01) | |
| *H01L 23/31* | (2006.01) | |
| *H01L 21/48* | (2006.01) | |
| *H01L 21/56* | (2006.01) | |
| *H01L 23/538* | (2006.01) | |
| *H01L 33/50* | (2010.01) | |
| *H01L 23/36* | (2006.01) | |
| *H01L 25/075* | (2006.01) | |
| *H01L 23/495* | (2006.01) | |

(52) U.S. Cl.
CPC .............. *H01L21/56* (2013.01); *H01L 21/561* (2013.01); *H01L 21/568* (2013.01); *H01L 23/3135* (2013.01); *H01L 23/36* (2013.01); *H01L 23/5389* (2013.01); *H01L 24/97* (2013.01); *H01L 33/507* (2013.01); *H01L 33/52* (2013.01); *H01L 33/62* (2013.01); *H01L 33/64* (2013.01); *H01L 23/3107* (2013.01); *H01L 23/49575* (2013.01); *H01L 25/0753* (2013.01); *H01L 2224/16* (2013.01); *H01L 2224/48091* (2013.01); *H01L 2224/73265* (2013.01); *H01L 2924/12041* (2013.01); *H01L 2924/12042* (2013.01); *H01L 2924/181* (2013.01); *H01L 2933/005* (2013.01); *H01L 2933/0041* (2013.01); *H01L 2933/0066* (2013.01); *H01L 2933/0075* (2013.01)

(56) References Cited

U.S. PATENT DOCUMENTS

| | | | |
|---|---|---|---|
| 4,935,312 A | 6/1990 | Nakayama et al. | |
| 5,684,330 A | 11/1997 | Lee | |
| 6,180,263 B1 | 1/2001 | Naoi | |
| 6,319,834 B1 | 11/2001 | Erb et al. | |
| 6,452,258 B1 | 9/2002 | Abys et al. | |
| 6,453,549 B1 | 9/2002 | Bhatt et al. | |
| 6,475,877 B1 | 11/2002 | Saia et al. | |
| 6,566,258 B1 | 5/2003 | Dixit et al. | |
| 6,699,782 B2 | 3/2004 | Kim | |
| 7,132,020 B2 | 11/2006 | Nozawa et al. | |
| 7,202,107 B2 | 4/2007 | Fuergut et al. | |
| 7,285,446 B2 | 10/2007 | Shibata | |
| 7,416,763 B2* | 8/2008 | Kanda ................... | H05K 3/388 427/252 |
| 7,435,910 B2 | 10/2008 | Sakamoto et al. | |
| 7,855,389 B2 | 12/2010 | Ishikura et al. | |
| 7,927,922 B2 | 4/2011 | Shen et al. | |
| 8,062,537 B2 | 11/2011 | Tuominen et al. | |
| 8,114,712 B1 | 2/2012 | McConnelee et al. | |
| 8,237,259 B2* | 8/2012 | Pressel ................... | H01L 24/19 257/678 |
| 8,240,032 B2 | 8/2012 | Iihola et al. | |
| 8,699,233 B2 | 4/2014 | Palm et al. | |
| 2003/0026078 A1 | 2/2003 | Komatsubara et al. | |
| 2003/0060041 A1* | 3/2003 | Datta ..................... | H01L 24/11 438/652 |
| 2005/0097735 A1 | 5/2005 | Kanda et al. | |
| 2006/0006404 A1 | 1/2006 | Ibbetson et al. | |
| 2006/0219428 A1 | 10/2006 | Chinda et al. | |
| 2007/0267136 A1 | 11/2007 | Tuominen et al. | |
| 2008/0261338 A1 | 10/2008 | Iihola et al. | |
| 2008/0314867 A1 | 12/2008 | Woychik et al. | |
| 2008/0318027 A1 | 12/2008 | Woychik et al. | |
| 2008/0318055 A1 | 12/2008 | Fillion et al. | |
| 2009/0027204 A1 | 1/2009 | Fujimaki et al. | |
| 2009/0275257 A1* | 11/2009 | Sun ....................... | H01L 33/505 445/50 |
| 2009/0289362 A1 | 11/2009 | Rhyner et al. | |
| 2010/0155925 A1* | 6/2010 | Kunimoto .............. | H01L 21/561 257/690 |
| 2011/0061909 A1 | 3/2011 | Palm et al. | |
| 2011/0175213 A1* | 7/2011 | Mori ...................... | H01L 23/13 257/675 |
| 2012/0040840 A1 | 2/2012 | Okayama et al. | |
| 2012/0218721 A1 | 8/2012 | Nishimura | |
| 2013/0056250 A1 | 3/2013 | Chung et al. | |
| 2013/0249080 A1 | 9/2013 | Lin et al. | |
| 2014/0210090 A1 | 7/2014 | Palm et al. | |
| 2015/0076545 A1 | 3/2015 | Nakatani et al. | |

FOREIGN PATENT DOCUMENTS

| | | |
|---|---|---|
| JP | 9-64247 | 3/1997 |
| JP | 10-223832 | 8/1998 |
| JP | 2001-250888 | 9/2001 |
| JP | 2002-170921 | 6/2002 |
| JP | 2003-239082 | 8/2003 |
| JP | 2005-19754 | 1/2005 |
| JP | 2006-165322 | 6/2006 |
| JP | 2008-503076 | 1/2008 |
| JP | 2008-522396 | 6/2008 |
| JP | 2009-253284 | 10/2009 |
| JP | 2010-80528 | 4/2010 |
| JP | 2011-134817 | 7/2011 |
| JP | 2011-523773 | 8/2011 |
| JP | 2012-109306 | 6/2012 |
| JP | 2012-134500 | 7/2012 |
| WO | 2010/018708 | 2/2010 |
| WO | 2011/062252 | 5/2011 |

OTHER PUBLICATIONS

English translation of the International Preliminary Report on Patentability issued Jun. 23, 2015 in International (PCT) Application No. PCT/JP2013/007502.
English translation of the International Preliminary Report on Patentability issued Jun. 23, 2015 in International (PCT) Application No. PCT/JP2013/007503.
English translation of the International Preliminary Report on Patentability issued Jun. 23, 2015 in International (PCT) Application No. PCT/JP2013/007504.
English translation of the International Preliminary Report on Patentability issued Jun. 23, 2015 in International (PCT) Application No. PCT/JP2013/007505.
International Search Report issued Mar. 18, 2014 in International Application No. PCT/JP2013/007501 (with English translation).
International Search Report issued Mar. 18, 2014 in International Application No. PCT/JP2013/007502 (with English translation).
International Search Report issued Mar. 18, 2014 in International Application No. PCT/JP2013/007503 (with English translation).
International Search Report issued Mar. 18, 2014 in International Application No. PCT/JP2013/007504 (with English translation).
International Search Report issued Mar. 18, 2014 in International Application No. PCT/JP2013/007505 (with English translation).
Office Action issued Feb. 22, 2016 in U.S. Appl. No. 14/422,294.
Office Action issued Feb. 25, 2016 in U.S. Appl. No. 14/422,615.
Office Action issued May 5, 2016 in U.S. Appl. No. 14/422,990.
Office Action issued May 26, 2016 in corresponding U.S. Appl. No. 14/422,972.

* cited by examiner

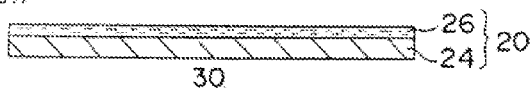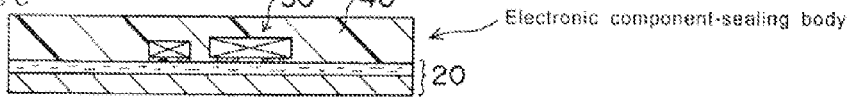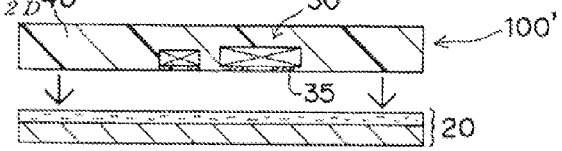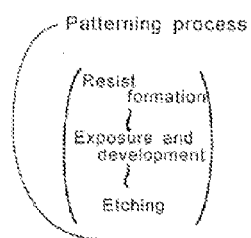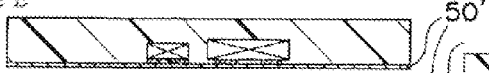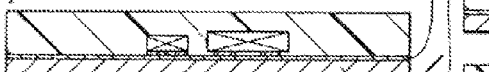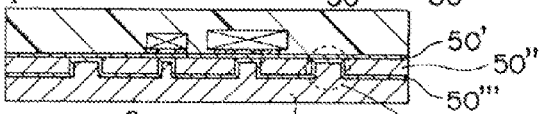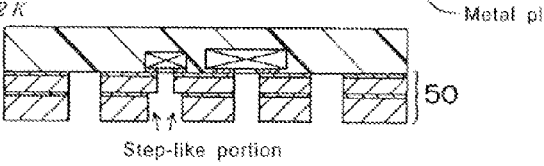

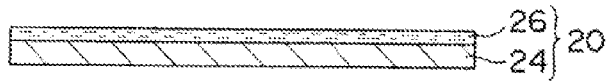
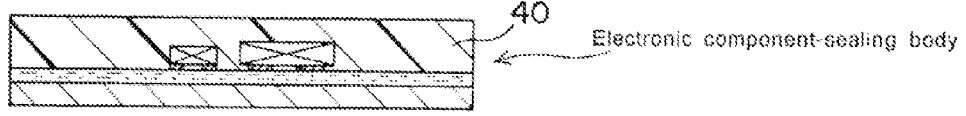
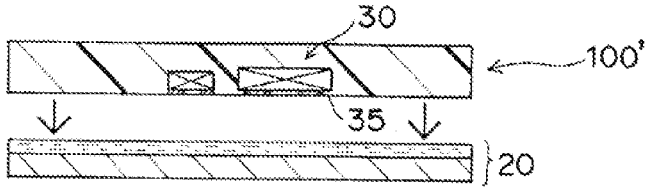
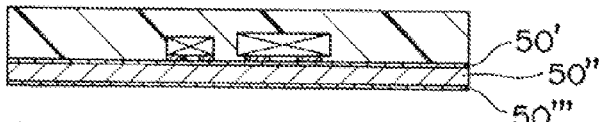
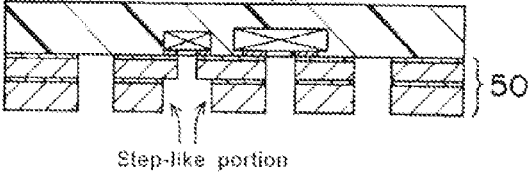

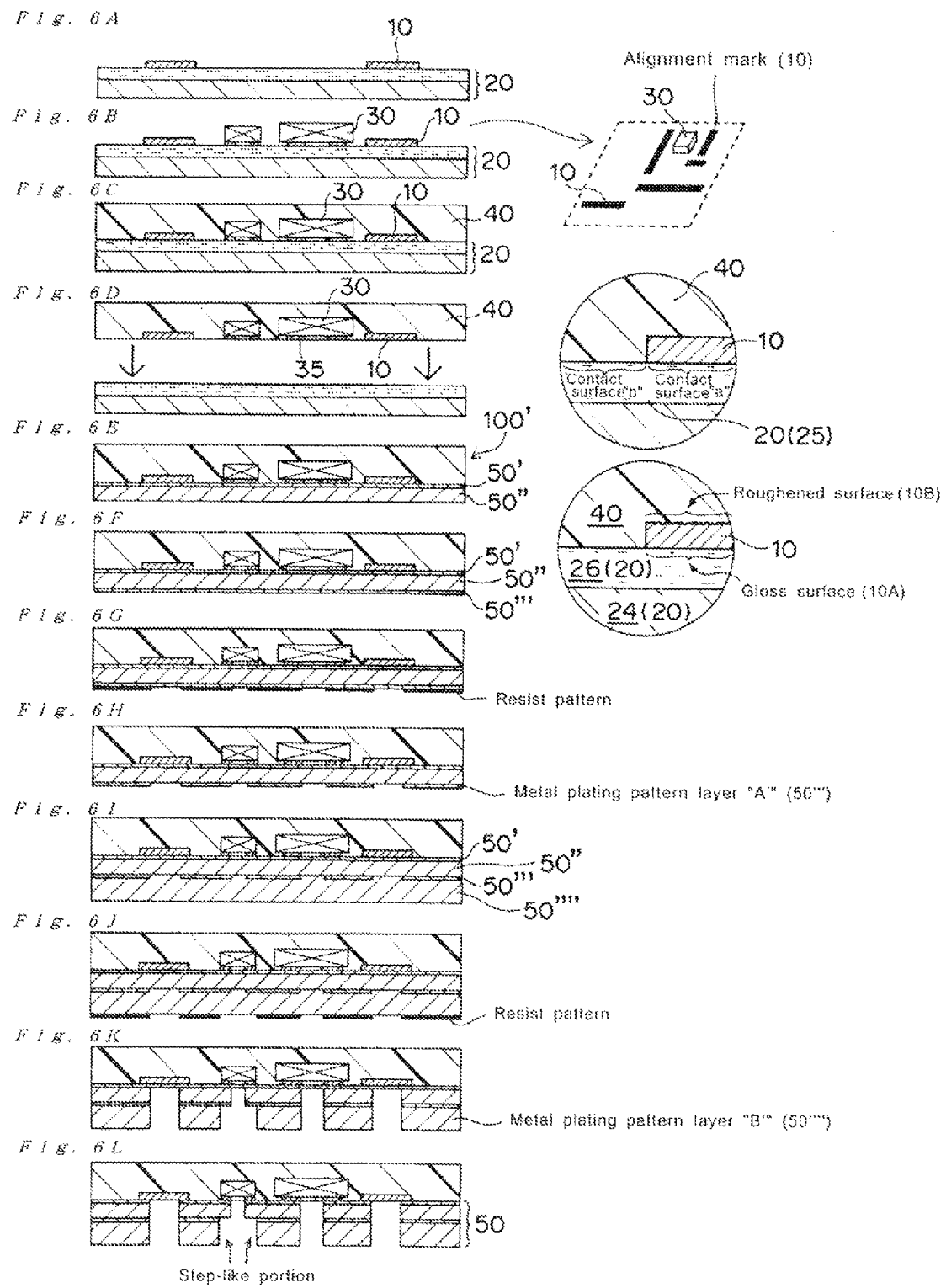

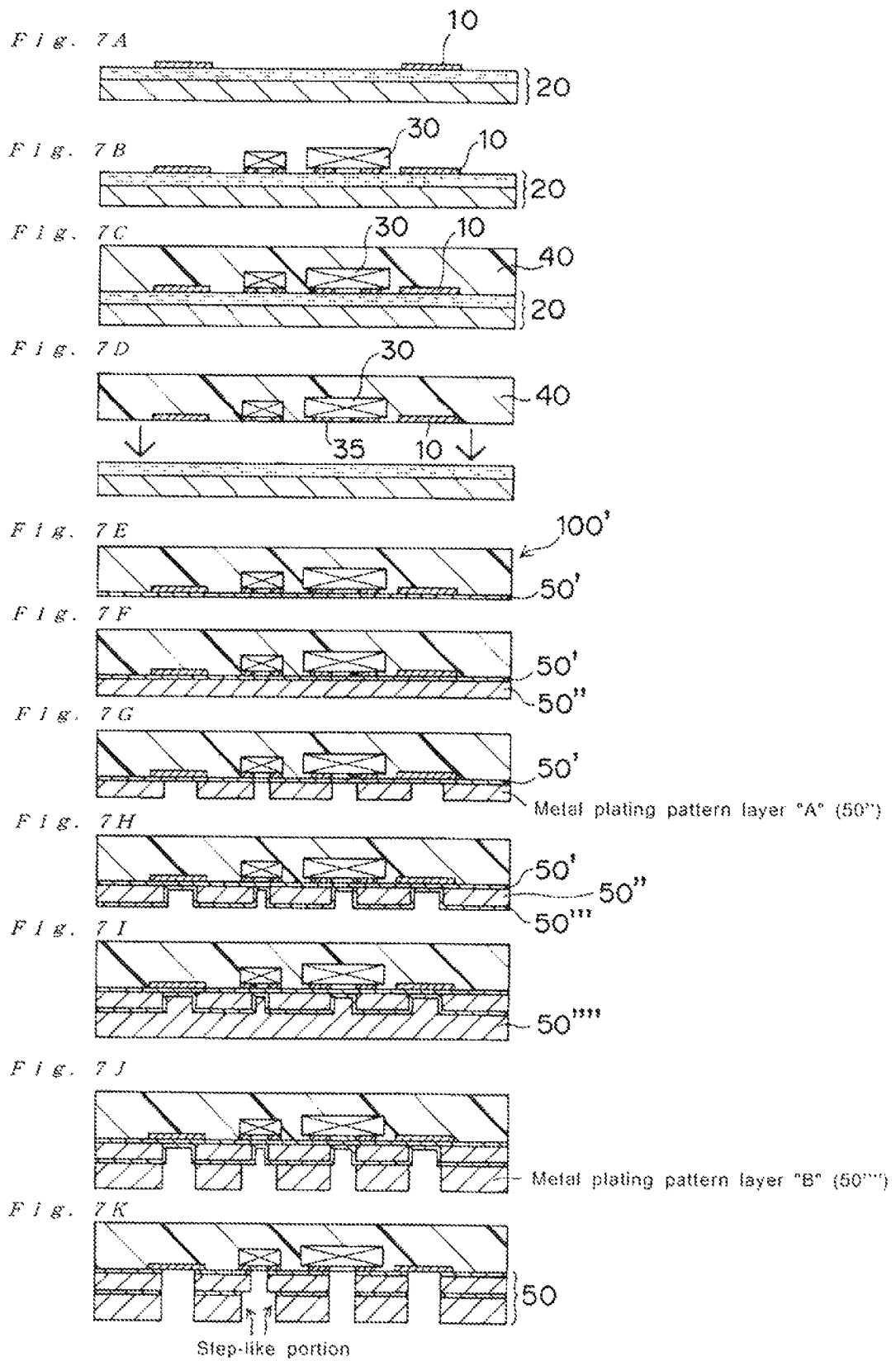

Package with circuit substrate
(Wiring-bonding type / Flip-chip type)

Package with lead frame

ELECTRONIC COMPONENT PACKAGE AND METHOD FOR MANUFACTURING THE SAME

TECHNICAL FIELD

The present disclosure relates to an electronic component package and a method for manufacturing the electronic component package. More particularly, the present disclosure relates to a package product equipped with an electronic component, and a method for manufacturing such package product.

BACKGROUND OF THE INVENTION

With the advance of electronic devices, various package technologies have been developed in the electronics field. For example, a packaging (i.e., packaging technique) using a circuit substrate or a lead frame has been developed for a mounting of electronic components such as IC and inductor. That is, there have been used "package with circuit substrate" and "package with lead frame" as a general package form for the electronic component.

"Package with circuit substrate" (see FIG. 15A) has such a form that the electronic component has been mounted on the circuit substrate. This package is generally classified as "Wire Bonding type (W/B type)" and "Flip Chip type (F/C type)". While on the other hand, "package with lead frame" (see FIG. 15B) has such a form that a lead frame, which may be composed of a lead or die pad, is included therein. In this lead frame-type package as well as the circuit substrate-type package, a bonding of the various electronic components is provided by a soldering or the like.

PATENT DOCUMENTS

Prior Art Patent Documents

PATENT DOCUMENT 1: U.S. Pat. No. 7,927,922
PATENT DOCUMENT 2: U.S. Pat. No. 7,202,107
PATENT DOCUMENT 3: JP2008-522396

Problems to be Solved by the Invention

The technologies of the prior art cannot provide a satisfactory performance in terms of a heat releasing and a connection reliability in a high-density packaging.

SUMMARY OF THE INVENTION

Under the above circumstances, an embodiment of the present invention has been created. In other words, an object of an embodiment of the present invention is to provide an electronic component package and a manufacturing method therefor, which can achieve an improvement of the heat releasing and the connection reliability in the high-density packaging.

Means for Solving the Problem

In order to achieve the above-mentioned object, an embodiment of the present invention provides a method for manufacturing an electronic component package,
wherein a package precursor is provided, in which an electronic component is embedded in a sealing resin layer such that an electrode of the electronic component is exposed at a surface of the sealing resin layer, and
wherein a combination of a formation process of a plurality of metal plating layers and a patterning process of the metal plating layers is provided to form a step-like metal plating layer, the formation process being performed by sequential dry and wet plating processes with respect to the package precursor, the patterning process being performed by a patterning of at least two of the metal plating layers.

Furthermore, an embodiment of the present invention provides an electronic component package, comprising:
a sealing resin layer;
an electronic component buried in the sealing resin layer; and
a step-like metal plating pattern layer in electrical connection with the electronic component,
wherein the step-like metal plating pattern layer is composed of an inside plating pattern and an outside plating pattern, the inside plating pattern being located relatively inside, and the outside plating pattern being located relatively outside, and
wherein a step-like shape of the metal plating pattern layer is due to an exposure of the inside plating pattern from the outside plating pattern.

Effect of the Invention

In accordance with the electronic component package according to an embodiment of the present invention, the metal plating layer is provided so that it is in direct contact with the electronic component, which can achieve the improvement of the heat releasing performance and the connection reliability in the high-density packaging.

BRIEF DESCRIPTION OF THE DRAWINGS

FIGS. 2A to 2K are process-cross sectional views schematically illustrating a manufacturing method of an electronic component package according to the first embodiment of the present invention.

FIGS. 4A to 4K are process-cross sectional views schematically illustrating a manufacturing method of an electronic component package according to the second embodiment of the present invention.

FIGS. 6A to 6L are process-cross sectional views schematically illustrating a manufacturing method of an electronic component package according to the third embodiment of the present invention.

FIGS. 7A to 7K are process-cross sectional views schematically illustrating a manufacturing method of an electronic component package according to the third embodiment of the present invention.

DETAILED DESCRIPTION OF THE INVENTION

Findings as Basis for Invention

The inventors have found out that the conventional packaging technologies mentioned in the paragraph "BACKGROUND OF THE INVENTION" have the following problems.

Figure 15A:
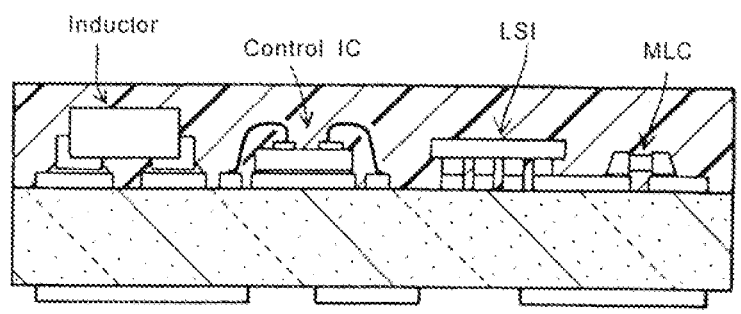
FIGS. 15A and 15B are cross-sectional views schematically illustrating a configurations of an electronic component package of the prior art.

The package technology regarding "package with circuit substrate" (see FIG. 15A) makes it possible to provide a high-density packaging. However, there has been still problem of a heat releasing, the problem being attributed to the presence of the circuit substrate. The cost of the substrate in itself is not negligible, and thus "package with circuit substrate" is not necessarily satisfactory in terms of cost. Furthermore, the cost for a wire bonding or flip-chip mounting is also not negligible, and thus the cost reduction thereof is desired. In this regard, a costly mounter is generally required in the flip-chip mounting.

Figure 15B:
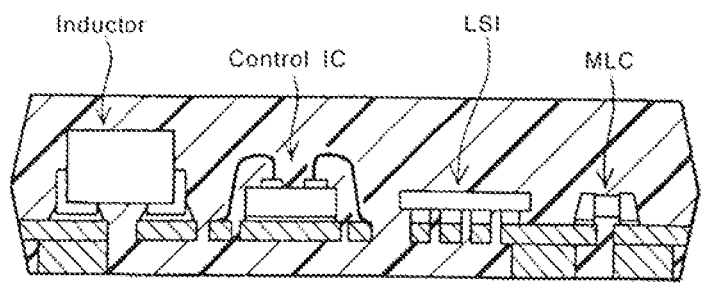

As for the lead frame-type package (see FIG. 15B), the lead frame in itself makes it difficult to provide a fine process. Thus, the lead frame-type package is not appropriate for the high-density packaging. The lead frame-type package as well as the circuit substrate-type package is associated with the soldering, which could raise a concern about so-called "solder flash" upon the whole sealing with resin material. Due to the solder flash, these packages are not necessarily satisfactory in terms of connection reliability. Specifically, there is such a concern that the solder material used for the connection of package components can be re-melted due to the heating of the soldering for module packaging, and thus the re-melted solder material may seeps into the fine interstices (the seeping being referred to "flash"), or may adversely cause a short circuit.

As a process for producing the fine electrodes, there has been used a semiadditive process wherein a resist layer is subjected to a patterning, and then a circuit is formed by a plating. The semiadditive process, however, makes it hard to provide the uniform height of the plating. In the semiadditive process, there is another concern in that the formation of a step-like electrode requires an additional polishing process every time the plating is completed, which can result in an additional cost.

Under the above circumstances, an embodiment of the present invention has been created. In other words, a main object of an embodiment of the present invention is to provide a packaging technology capable of satisfying the desired heat releasing and connection reliability in the high-density packaging, while achieving a low-cost mounting.

Rather than addressing as merely extensions of conventional arts, the inventors tried to accomplish the above main object by addressing from a new point of view. As a result, the inventors have created the invention of an electronic component package and a manufacturing method thereof, both of which are capable of achieving the above main object. Specifically, an embodiment of the present invention provides a method for manufacturing an electronic component package, wherein a package precursor is provided, in which an electronic component is in an embedded state in a sealing resin layer such that an electrode of the electronic component is exposed at a surface of the sealing resin layer, wherein a combination of a formation process of a plurality of metal plating layers and a patterning process of the metal plating layers is performed to form a step-like metal plating layer, the formation process being performed by sequential dry and wet plating processes with respect to the package precursor, the patterning process being performed by a patterning of at least two of the metal plating layers.

One of the features of the manufacturing method of the electronic component package according to an embodiment of the present invention is that the combination of the formation process of a plurality of metal plating layers and the patterning process of the metal plating layers is provided to form the step-like metal plating layer as a whole, the formation process being performed by sequential dry and wet plating processes with respect to the package precursor, the patterning process being performed by the patterning of the at least two of the metal plating layers.

Furthermore, an embodiment of the present invention also provides an electronic component package, comprising:

a sealing resin layer;

an electronic component buried in the sealing resin layer; and a step-like metal plating pattern layer in electrical connection with the electronic component, wherein the step-like metal plating pattern layer is composed of an inside plating pattern and an outside plating pattern, the inside plating pattern being located relatively inside, and the outside plating pattern being located relatively outside, and wherein a step-like form of the metal plating pattern layer is due to an exposure of the inside plating pattern from the outside plating pattern.

One of the features of the electronic component package according to an embodiment of the present invention is that the metal plating pattern layer is composed of two plating patterns, i.e., the inside plating pattern located relatively inside and the outside plating pattern located relatively outside, and that the step-like form of the metal plating pattern layer is provided by a local exposure of the inside plating pattern from the outside plating pattern.

In accordance with an embodiment of the present invention, the desired heat releasing performance and connection reliability can be satisfied while achieving the low-cost mounting.

With respect to the "heat-releasing performance" according to an embodiment of the present invention, a mounting with no wire bonding or no bump is provided (that is, there is provided a wire bonding-less/bump-less package), which enables the heat from the electronic component to be released effectively via the metal plating layer (metal plating pattern layer). In this regard, the metal plating layer (metal plating pattern layer) can be made of a material with high thermal conductivity (e.g., copper material), and also can be provided as "thick layer having the large thickness". Therefore, an embodiment of the present invention makes it possible to effectively release the heat via the metal plating layer to the outside thereof. An embodiment of the present invention can also achieve a packaging with no need of "soldering". As a result, the packaging with no soldering material included therein can be achieved. This makes it possible to avoid the unfavorable "solder flash", which leads to an improvement of the connection reliability.

In accordance with the manufacturing method according to an embodiment of the present invention, "metal plating portion with its step-like form" can be provided by a patterning process of a subtractive process after the allover plating process, which can not only reduce a variation in the plating height, but also requires no polishing process. This results in a low cost manufacturing of the package. Furthermore, the metal plating portion with its step-like form can contribute to both of "fine line portion" and "high heat-releasing portion" in the package. Specifically, the stepped metal plating portion enables the plating thickness to be small and fine, the plating thickness being provided on the electronic component and thus required to be fine line. On the other hand, the stepped metal plating portion enables the plating thickness on the electronic component to be thick, the electronic component being a source of heat generation. Consequently, the manufacturing method according to an embodiment of the present invention can suitably achieve both of high-density mounting and heat releasing performance.

Furthermore, the package according to an embodiment of the present invention has a "substrate-less structure". The substrate-less structure, i.e., no substrate of the package can contribute to a low-cost manufacturing of the package due to no cost of the substrate. As for such "substrate-less structure", it makes possible to achieve a more simplified packaging process, compared to the wire bonding or flip-chip mounting process, which can also contribute to the low cost manufacturing.

An electronic component package and a manufacturing method thereof according to an embodiment of the present invention will be hereinafter described in more detail. It should be noted that various parts or elements are schematically shown in the drawings wherein their dimensional proportions and their appearances are not necessarily real ones, and are merely illustrated for the purpose of making it easy to understand the present invention.

[Manufacturing Method of Present Invention]

Figure 1:
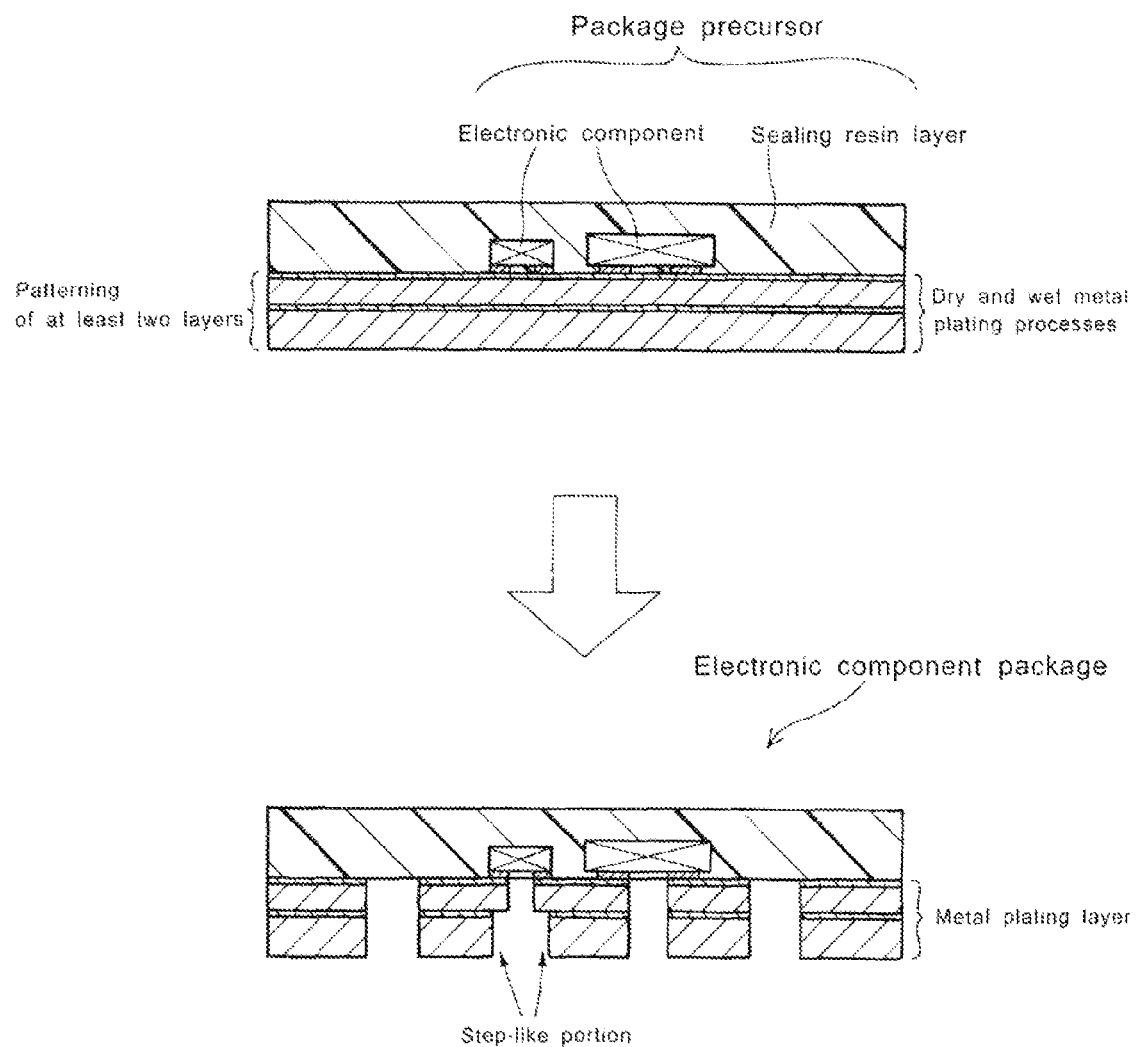
FIG. 1 includes schematic illustrations showing a concept of a manufacturing method of an electronic component package according to an embodiment of the present invention.

The manufacturing method of the electronic component package according to an embodiment of the present invention will be described below. In the manufacturing method of the electronic component package according to an embodiment of the present invention, a step-like metal plating layer is formed by a combination of sequential dry and wet plating processes with respect to "package precursor with an electronic component embedded in a sealing resin layer thereof", and a patterning process of at least two of the resulting metal plating layers. See FIG. 1.

More specifically, the package precursor is provided, in which at least one kind of electronic component is in an embedded state in a sealing resin layer such that an electrode of the electronic component is exposed at the surface of the sealing resin layer. Thereafter, the combination of "formation process of a plurality of metal plating layers wherein the sequential dry and wet plating processes are performed with respect to the surface of the sealing resin layer of the package precursor, the electrode of the electrode of the electronic component being exposed at the surface of the sealing resin layer" and "patterning process of the resulting metal plating layers wherein at least two of the metal plating layers are subjected to a patterning process" is performed to form the step-like metal plating layer.

For example, (1) dry plating process→(2) wet plating process→(3) dry or wet plating process→(4) wet plating process are sequentially performed with respect to the sealing resin layer's surface from which the electrode of the electronic component is exposed, and also the patterning process of at least two of the metal plating layers obtained by such sequential plating processes is performed. By way of example, the two plating layer obtained by the above (2) and (4) is subjected to the patterning process (Type I). Alternatively, the two plating layer obtained by the above (3) and (4) is subjected to the patterning process (Type II).

Particularly in the patterning process of the plating layer formed by the above (4), such an etchant is preferably used that is capable of dissolving and removing the metal plating layer which has been formed immediately before the patterning process (i.e., capable of dissolving and removing the metal plating layer obtained by the above (4) of the wet plating process), while being not capable of dissolving and removing the more prior metal plating layer which has been formed at a point in time before the immediately-formed layer (i.e., not capable of dissolving and removing the metal plating layer obtained by the above (3) of the plating process). In a case where (1) dry plating process→(2) wet plating process→(3) dry plating process→(4) wet plating process are sequentially performed, it is preferable to use the etchant for the patterning process, capable of dissolving and removing the metal plating layer obtained by the above (4) of the wet plating process, while being not capable of dissolving and removing the metal plating layer obtained by the above (3) of the dry plating process. This means that the metal plating layer obtained by the above (3) of the dry plating process, which cannot be dissolved and removed by the etchant, serves as a stopper for the patterning process (i.e., an etching-blocking part for the etching process). In other words, a preferred embodiment of the manufacturing method of the present invention is as follows.

The metal plating layer formed after the preceding patterning for one of the at least two of the metal plating layers (e.g., metal plating layer obtained by the above (3) of the dry plating process performed after the patterning process of the metal plating layer formed by the above (2) of the wet plating process in a case of Type I), or the metal plating layer provided by the preceding patterning for one of the at least two of the metal plating layers (e.g., pattern layer obtained by the patterning process of the metal plating layer formed by the above (3) of the dry plating process in a case of Type II) is used as an etching-blocking part for an etching process performed in the succeeding patterning for the other of the at least two of the metal plating layers (e.g., etching-blocking part for the etching process performed in the patterning process of the metal plating layer formed by the above (4) of the wet plating process in the case of Types I or II).

As such, the dry and wet metal plating processes are sequentially performed, and thereafter the selective patterning process of the at least two of the resulting metal plating layers is performed to provide "step-like metal plating layer".

The term "step-like" as used herein regarding the step-like metal plating layer means that a metal plating layer composed of a plurality of sub-plating layers has such a form that it has a thick portion and a thin portion as a whole. In other words, the metal plating layer in electrical connection with the electrode portion of the electronic component has a stepwise thickness in which local thicknesses thereof differs from each other.

The manufacturing method of the present invention can be performed in various process embodiments, which will be now described below.

First Embodiment

The process of the manufacturing method according to the first embodiment of the present invention is shown in FIGS. 2A-2K and FIGS. 3A-3C.

The first embodiment of the present invention is characterized in that the formation of the step-like metal plating layer comprises the steps of:

(i) performing the dry plating process wholly with respect to a principal surface of the sealing resin layer to form a first metal plating layer, the surface of the electrode of the electronic component being exposed at the principal surface of the sealing resin layer;

(ii) performing the wet plating process wholly with respect to a principal surface of the first metal plating layer to form a second metal plating layer;

(iii) subjecting the second metal plating layer to the patterning process to form a metal plating pattern layer "A" configured to locally expose the first metal plating layer;

(iv) performing the dry or wet plating process wholly with respect to the metal plating pattern layer "A" and the locally exposed portion of the first metal plating layer to form a third metal plating layer;

(v) performing the wet plating process wholly with respect to a principal surface of the third metal plating layer to form a fourth metal plating layer;

(vi) subjecting the fourth metal plating layer to the patterning process to form a metal plating pattern layer "B" configured to locally expose the third metal plating layer; and (vii) removing the exposed portion of the third metal plating layer and a local portion of the first metal plating layer, the local portion being located beneath the exposed portion of the third metal plating layer.

The first embodiment will now be described in more detail. First, the package precursor is provided. Such provision of the package precursor preferably comprises the steps of:

placing the electronic component on an adhesive carrier such that the electronic component is attached to the adhesive carrier;

forming the sealing resin layer on the adhesive carrier such that the electronic component is covered with the sealing resin layer; and peeling away the adhesive carrier from the sealing resin layer, and thereby the electrode of the electronic component is exposed at the surface of the sealing resin layer.

More specifically, as shown in FIGS. 2A and 2B, at least one kind of electronic component 30 is placed on the adhesive carrier 20. That is, a mounting of the electronic component 30 is performed with respect to the adhesive carrier 20. It is preferred that the electronic component 30 is placed such that the electrode 35 thereof makes contact with the adhesive carrier 20. This enables the electrode 35 of the electronic component 30 to be suitably exposed at a later step for the peeling removal of the carrier.

The electronic component 30 may be any suitable one as long as it is a circuit component/element used in the electronics packaging field. Examples of the electronic component may include an IC (e.g., control IC), an inductor, a semiconductor element (e.g., MOS: metal-oxide semiconductor), a capacitor, a power element, a light-emitting element (e.g., LED), a chip resistor, a chip capacitor, a chip varistor, a chip thermistor and a chip laminate filter, a connection terminal and the like.

The adhesive carrier 20 is a carrier sheet composed of a base and an adhesive layer, for example. As shown in FIG. 2A, the carrier sheet having a two-layered structure in which the adhesive layer 26 is provided on a supporting base 24 may be used. In terms of a suitable peeling of the adhesive carrier (the peeling being later performed), it is preferred that the supporting base 24 is flexible.

The supporting base 24 of the carrier sheet may be any suitable sheet-like part as long as it cannot adversely affect "disposing/placing of the electronic component" or "formation of the sealing resin layer", both of which will be later performed. For example, the material for the supporting base 24 may be a resin, a metal and/or a ceramic. Examples of the resin may include polyester resin (e.g., polyethylene terephthalate, polyethylene naphthalate), acrylic resin (e.g., polymethylmethacrylate), polycycloolefin and polycarbonate. Examples of the metal for the supporting base 24 may include iron, copper, aluminum and alloys thereof. By way of example, the metal may be a stainless material (e.g., SUS). Examples of the ceramic for the supporting base 24 may include apatite, alumina, silica, silicon carbide, silicon nitride, and boron carbide. The thickness of the supporting base is preferably in the range of 0.1 mm to 2.0 mm, more preferably in the range of 0.2 mm to 1.0 mm (for example, 0.2 mm), because of its "sheet-like" form.

While on the other hand, the adhesive layer 26 may be any suitable one as long as it has an adhesive property with respect to the electronic component. For example, the adhesive layer may comprise at least one kind of adhesive material selected from the group consisting of acrylic resin-based adhesive, urethane resin-based adhesive, silicone resin-based adhesive and epoxy resin adhesive. The thickness of the adhesive layer 26 is preferably in the range of 2 μm to 50 μm, more preferably in the range of 5 μm to 20 μm (for example, 10 μm). As the adhesive layer 26, a double-faced adhesive tape may be used. In this regard, the double faced tape wherein an adhesive layer is provided on both principal surfaces of a resin film layer (e.g., PET film) may be used, for example.

Subsequent to the placement of the electronic component onto the adhesive carrier 20, a sealing resin layer 40 is formed on the adhesive carrier 20 such that the electronic component 30 is covered with the sealing resin layer 40 (see FIG. 2C). This results in a production of an electronic component-sealing body. The formation of the sealing resin layer 40 can be performed by applying a resin material onto an adhesive surface of the adhesive carrier 20 by a spin-coating process or a doctor-blade process, followed by being subjected to a heat treatment or light-exposure treatment thereof. In other words, the sealing resin layer 40 can be provided by subjecting the applied resin material to a heat or light curing treatment. Alternatively, the sealing resin layer 40 may be provided by putting a resin film on the adhesive surface of the adhesive carrier 20. Additionally, the sealing resin layer 40 may be provided by filling an uncured powdered or liquid resin into a die, followed by a heat curing thereof.

The material for the sealing resin layer 40 may be any suitable one as long as it exhibits an electrical insulation property. For example, the material of the sealing resin layer may be an epoxy-based resin or a silicone-based resin. The thickness of the sealing resin layer 40 is preferably in the approximate range of 0.5 n to 5.0 mm, and more preferably in the approximate range of 1.2 mm to 1.8 mm.

Subsequent to the formation of the sealing resin layer, the adhesive carrier 20 is peeled away from the electronic component-sealing body. Namely, the adhesive carrier 20 is removed from the electronic component-sealing body. The removal of the adhesive carrier enables the electrode 35 of the electronic component 30 to be exposed at the surface of the sealing resin layer 40, which results in a production of the package precursor 100'.

Subsequent to the production of the package precursor 100', the steps (i) and (ii) are carried out. Namely, as shown in FIG. 2E, the dry plating process is performed wholly with respect to the principal surface of the sealing resin layer to form the first metal plating layer 50', the surface of the electrode of the electronic component being exposed at the principal surface of the sealing resin layer. Thereafter, the wet plating process is performed wholly with respect to the principal surface of the first metal plating layer 50' to form the second metal plating layer 50". Such steps have such a process feature that a metal layer is directly provided with respect to the exposed surface of the electrode of the electronic component. The second metal plating layer 50" can be provided as a thick layer. Particularly when focusing on the manufacturing processes, due to the dry plating process, the plating layer with being thick and having good adhesion can be formed by the subsequent wet plating process.

Examples of the dry plating process include a vacuum plating process (Physical Vapor Deposition, i.e., PVD process) and a chemical vapor plating process (Chemical Vapor Deposition, i.e., CVD process). Examples of the vacuum plating process include a sputtering process, a vacuum deposition process, and an ion plating process. On the other hand, examples of the wet plating process include an electroplating process (e.g., electrolytic plating process), a chemical plating process, and a hot-dip plating process. In a preferred embodiment of the manufacturing method of the present invention, the sputtering may be performed as the dry plating process, whereas the electroplating (e.g., electrolytic plating) may be performed as the wet plating process.

It is preferred that the first metal plating layer 50' with its thickness of 100 n to 1000 nm is formed by the dry plating process (see FIG. 2E), and thereafter the second metal plating layer 50" with Its thickness of 18 µm to 500 µm is formed by the wet plating process (see FIG. 2F). Namely, the first metal plating layer 50' is provided in the very thin form, whereas the second metal plating layer is provided in the thick form, which leads to a large thickness of the metal plating layer as a whole.

The first metal plating layer 50' formed by the dry plating process preferably comprises at least one kind of metal material selected from the group consisting of Ti (titanium), Cr (chromium), Ni (nickel), W (tungsten), Cu (copper) and alloy (e.g., alloy consisting of at least two kind thereof). While on the other hand, the second metal plating layer 50" formed by the wet plating process preferably comprises at least one kind of metal material selected from the group consisting of Ag (silver), Cu (copper), Ni (nickel), Ti (titanium) and Al (aluminum).

Subsequent to the steps (i) and (ii), the step (iii) is carried out. Namely, as shown in FIG. 2G, the second metal plating layer 50" is subjected to the patterning process to form a metal plating pattern layer "A" configured to locally expose the first metal plating layer 50'. The patterning process can be performed through a formation of a resist layer with a predetermined pattern, as shown in the right-sided illustrations of FIGS. 2A-2K. The patterning in itself is not particularly limited as long as it is used in the electronics packaging field. For example, a photolithography process can be available for the patterning process, in which case a formation of the resist layer, an exposure to the light and subsequent development, and an etching are sequentially performed. Specifically, the resist layer is formed in an allover form on the second metal plating layer, and then is subjected to the patterning process so that the resist layer has the predetermined form of patterning. Thereafter, the etching treatment is performed via the patterned resist layer to remove the local portions of the second metal plating layer. As a result, there can be formed the metal plating pattern layer "A" (after the eventual removal of the resist layer).

Subsequent to the step (iii), the step (iv) is carried out. Namely, as shown in FIG. 2H, the dry or wet plating process is performed wholly with respect to the metal plating pattern layer "A" (i.e., the patterned second metal plating layer 50") and the locally exposed portion of the first metal plating layer 50' to form the third metal plating layer 50'''. "Dry plating process" or "wet plating process" of the step (iv) may be similar to that of the above steps (I) and (ii).

As shown in FIG. 2(i), the third metal plating layer 50''' is formed in the step (iv) such that it locally has a bended form along an outline of the surface of the metal plating pattern layer "A".

Subsequent to the step (iv), the step (v) is carried out. Namely, as shown in FIG. 2I, the wet plating process is performed wholly with respect to the principal surface of the third metal plating layer 50''' to form the fourth metal plating layer 50''''. "Wet plating process" of the step (v) may also be similar to that of the above step (ii).

As shown in FIG. 2I, it is preferable to form the fourth metal plating layer 50'''' having a form of thickness on the third metal plating layer 50''' with a dent portion formed by the bended form of the third metal plating layer 50''' being filled with the fourth metal plating layer 50''''.

Subsequent to the step (v), the step (vi) is carried out. Namely, as shown in FIG. 2J, the fourth metal plating layer 50'''' is subjected to the patterning process to form the metal plating pattern layer "B" configured to locally expose the third metal plating layer 50'''. The patterning process of the step (vi) may be similar to that of the above step (iii).

As shown in FIG. 2J, the metal plating pattern layer "B" preferably has such a form that the local region "P" located outside the dent portion formed by the bended form of the third metal plating layer 50''' is more widely removed than that of such dent portion.

The formation of the metal plating pattern layer "B" makes use of the etchant capable of dissolving and removing the fourth metal plating layer 50'''', while being not capable of dissolving and removing the third metal plating layer 50'''. From another point of view, the third metal plating layer 50''', which cannot be dissolved and removed by the etchant of the step (vi), can serve as the stopper for the patterning process of the step (vi), i.e., the etching-blocking part for the etching process performed in the step (vi). For example in a case where the fourth metal plating layer 50'''' is made of copper, and the third metal plating layer 50''' is made of Ti (titanium), the etchant with a hydrogen peroxide included therein as a main component (e.g., WLC-T, MITSUBISHI GAS CHEMICAL COMPANY, INC.) can be used as the etchant with selectivity property for the step (vi).

Subsequent to the step (vi), the step (vii) is carried out. Namely, as shown in FIG. 2K, the exposed portion of the third metal plating layer 50''' and a local portion of the first metal plating layer 50' are removed, the local portion being located beneath the exposed portion of the third metal plating layer 50'''.

Such removal treatment preferably makes use of the etchant capable of dissolving and removing the first and third metal plating layers 50", 50'''', while being not capable of dissolving and removing the second and fourth metal plating layers 50'', 50''''. For example in a case where the second and fourth metal plating layers 50'', 50'''' are made of copper, and the first and third metal plating layers 50', 50''' are made of Ti (titanium), the etchant with a hydrogen peroxide included therein as a main component (e.g., WLC-T, MITSUBISHI GAS CHEMICAL COMPANY, INC.) can be used as the etchant in the removal step (vii).

The removed portion in the step (vii) is a surface portion of the plating, i.e., "exposed portion of the third metal plating layer" and "local portion of the first metal plating layer, located beneath the exposed portion of the third metal plating layer". More specifically, "exposed portion of the third metal plating layer" corresponds to a local exposed portion of the third metal plating layer 50''', the local exposed portion being attributed to the patterning process of the preceding step (vi). While on the other hand, "local portion of the first metal plating layer, located beneath the exposed portion of the third metal plating layer" corresponds to a local portion of the first metal plating layer 50', located beneath the third metal plating layer 50''' and in direct contact with the third metal plating layer 50'''. By way of example, such local portion of the first metal plating layer corresponds to "Q" portion in FIG. 2J.

Through the above steps, i.e., the provision step of the package precursor and the subsequent steps (i)-(vii), there can be finally provided the step-like metal plating layer 50 composed of the first to fourth sub-metal plating layers (see FIG. 2K).

Figure 3A:
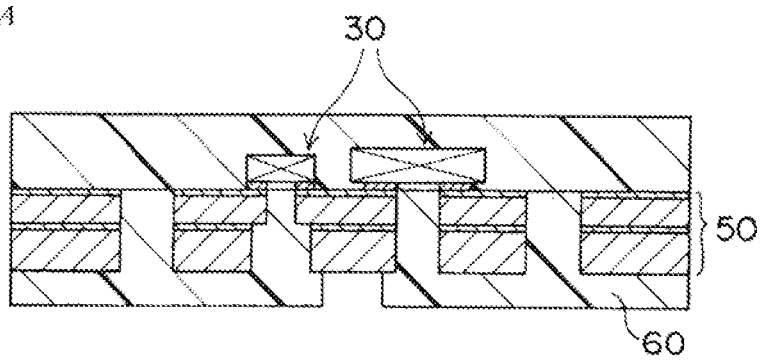
FIGS. 3A to 3C are process-cross sectional views schematically illustrating a manufacturing method of an electronic component package according to the first embodiment of the present invention.

After the formation of the layer 50, a resist layer 60 is preferably formed with respect to the step-like metal plating layer 50. For example, it is preferred as shown in FIG. 3A that a solder resist layer 60 is formed on the surface of the sealing resin layer (the surface being exposed due to the removal of the adhesive carrier) such that the metal plating pattern layer 50 is partially covered with the resist layer 60. The formation of the resist layer 60 may be the same as that generally performed in the electronics packaging field.

Figure 3B:
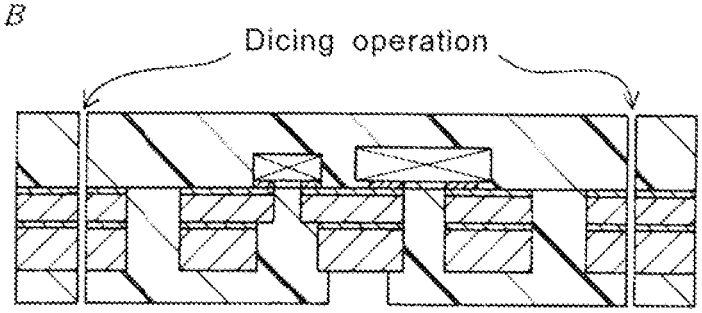
Figure 3C:
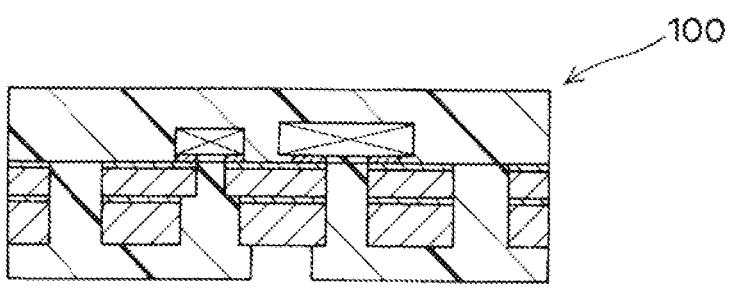

Through the above steps (with an additional step of the dicing operation as shown in FIG. 3B, for example), there can be finally obtained an electronic component package 100 as shown in FIG. 3C.

Second Embodiment

The process of the manufacturing method according to the second embodiment of the present invention is shown in FIGS. 4A-4K and FIGS. 5A-5C.

The second embodiment of the present invention is characterized in that the formation of the step-like metal plating layer comprises the steps of:

(i)' performing the dry plating process wholly with respect to a principal surface of the sealing resin layer to form a first metal plating layer, the surface of the electrode of the electronic component being exposed at the principal surface of the sealing resin layer;

(ii)' performing the wet plating process wholly with respect to a principal surface of the first metal plating layer to form a second metal plating layer;

(iii)' performing the dry or wet plating process wholly with respect to a principal surface of the second metal plating layer to form a third metal plating layer;

(iv)' subjecting the third metal plating layer to the patterning process to form a metal plating pattern layer "A'" configured to locally expose the second metal plating layer;

(v)' performing the wet plating process wholly with respect to the metal plating pattern layer "A'" and the locally exposed portion of the second metal plating layer to form a fourth metal plating layer;

(vi)' subjecting the fourth metal plating layer to the patterning process to form a metal plating pattern layer "B'" configured to locally expose the first and third metal plating layers; and (vii)' removing the locally exposed portion of the first and third metal plating layers.

As shown in FIGS. 4A-4f, the provision of the package precursor 100', the steps (i)' and (ii)' in the second embodiment are respectively the same as the provision of the package precursor 100', the steps (i) and (ii) in the first embodiment.

Subsequent to the step (ii)', the step (iii)' is carried out. Namely, as shown in FIG. 4G, the dry or wet plating process is performed wholly with respect to the principal surface of the second metal plating layer 50'' to form the third metal plating layer 50'''. The dry or wet plating process in itself may be similar to that of the first embodiment of the present invention. That is, the sputtering is performed as the dry plating process, whereas the electroplating (e.g., electrolytic plating process) is performed as the wet plating process.

As shown in FIG. 4G, the third metal plating layer 50''' is formed wholly on the non-patterned second metal plating layer 50''. Thus, the third metal plating layer 50''' has a form of flat layer.

Subsequent to the step (iii)', the step (iv)' is carried out. Namely, as shown in FIG. 4H, the third metal plating layer 50''' is subjected to the patterning process to form a metal plating pattern layer "A'" configured to locally expose the second metal plating layer 50''. The patterning process of the step (iv)' in itself can be similar to that of the first embodiment of the present invention, and thus it can be performed by the photolithography process using the predetermined pattern of the resist layer.

Subsequent to the step (iv)', the step (v)' is carried out. Namely, as shown in FIG. 4I, the wet plating process is performed wholly with respect to the metal plating pattern layer "A'" and the locally exposed portion of the second metal plating layer 50'' to form the fourth metal plating layer 50''''. In particular, the fourth metal plating layer 50'''' is preferably formed such that the metal plating pattern layer "A'" located on the second metal plating layer 50'' is covered with the fourth metal plating layer 50'''' (i.e., the third metal plating layer 50''' is covered with the fourth metal plating layer 50'''').

Subsequent to the step (v)', the step (vi)' is carried out. Namely, as shown in FIG. 4J, the fourth metal plating layer 50'''' is subjected to the patterning process to form a metal plating pattern layer "B'" configured to locally expose the first and third metal plating layers 50', 50'''. The patterning process of the step (vi)' in itself can be similar to that of the first embodiment of the present invention, and thus it can be performed by the photolithography process using the predetermined pattern of the resist layer.

As shown in FIG. 4J, the metal plating pattern layer "B'" preferably has such a form that the local region "S" located outside the spaced portion "R" of the metal plating pattern layer "A'" has been more widely removed than the spaced portion "R".

Similarly to the first embodiment, the formation of the metal plating pattern layer "B'" makes use of the etchant capable of dissolving and removing the fourth metal plating layer 50'''' (more preferably not only the fourth metal plating layer 50'''' but also the second metal plating layer 50''), while being not capable of dissolving and removing the third metal plating layer 50''' (more preferably not only the third metal plating layer 50''' but also the first metal plating layer 50'). From another point of view, the third metal plating layer 50''', which cannot be dissolved and removed by the etchant of the step (vi)', can serve as the stopper for the patterning process of the step (vi)', i.e., the etching-blocking part for the etching process performed in the step (vi)'. Similarly to the first embodiment, for example in a case where the fourth and second metal plating layers 50''', 50'' are made of copper, and the third metal plating layer 50''' is made of Ti (titanium), the etchant with a hydrogen peroxide included therein as a main component (e.g., WLC-T, MITSUBISHI GAS CHEMICAL COMPANY, INC.) can be used as the etchant in the step (vi)'.

Subsequent to the step (vi)', the step (vii)' is carried out. Namely, as shown in FIG. 4K, the locally exposed portion of the first and third metal plating layers 50', 50''' are removed.

The removed portion in the step (vii)' is a surface portion of the plating, i.e., "exposed portion of the first metal plating layer" and "exposed portion of the third metal plating layer". More specifically, each of the exposed portion of the third and first metal plating layers corresponds to a local exposed portion of each of the third and first metal plating layers 50', 50''', such local exposed portion being attributed to the patterning process of the preceding step (vi)'. Similarly to the first embodiment, the removal treatment of the step (vii)' preferably makes use of the etchant capable of dissolving and removing the first and third metal plating layers 50', 50''' while being not capable of dissolving and removing the second and fourth metal plating layers 50'', 50''''. For example in a case where the second and fourth metal plating layers 50'', 50'''' are made of copper, and the first and third metal plating layers 50', 50''' are made of Ti (titanium), the etchant with a hydrogen peroxide included therein as a main component (e.g., WLC-T, MITSUBISHI GAS CHEMICAL COMPANY, INC.) may be used as the etchant in the removal step (vii)'.

Figure 5A:
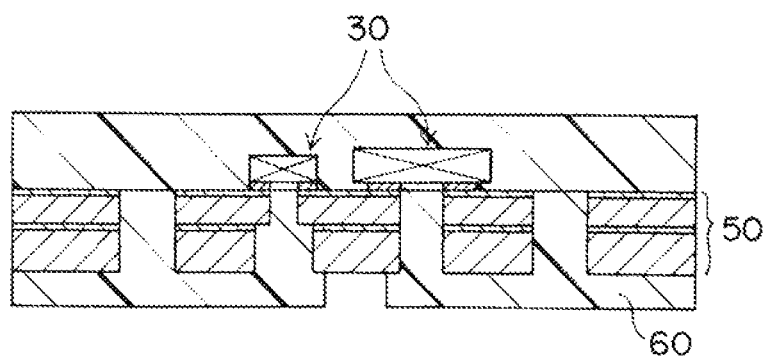
FIGS. 5A to 5C are process-cross sectional views schematically illustrating a manufacturing method of an electronic component package according to the second embodiment of the present invention.
Figure 5B:
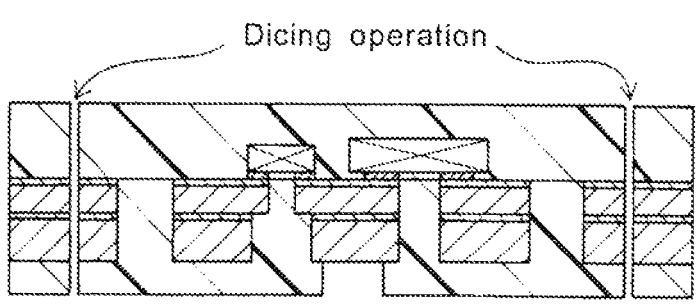
Figure 5C:
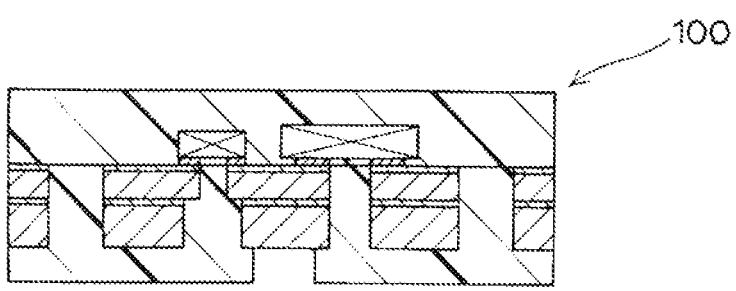

Through the above steps, i.e., the provision step of the package precursor and the subsequent steps (i)'-(vii)', there can be finally provided the step-like metal plating layer 50 composed of the first to fourth sub-metal plating layers (see FIG. 4K). After the formation of the step-like metal plating layer 50, the formation of the solder resist layer 60 and the dicing operation are performed (see FIGS. 5A and 5B). As a result, there can be finally obtained an electronic component package 100 as shown in FIG. 5C.

Third Embodiment

The main process of the manufacturing method according to the third embodiment of the present invention is shown in FIGS. 6A-6L and FIGS. 7A-7K. In the formation of the package precursor 100' according to the third embodiment of the present invention, the metal pattern layer 10 is disposed on the adhesive carrier 20, and thereafter the electronic component 30 is placed on the adhesive carrier 20 such that the placed electronic component 30 is not overlapped with the metal pattern layer 10.

Specifically, as shown in FIGS. 6A and 7A, the metal pattern layer 10 is disposed on the adhesive carrier 20. More specifically, the disposing of the metal pattern layer 10 is performed such that the metal pattern layer 10 is attached to the adhesive carrier 20. Such metal pattern layer 10 is a patterned metal layer which has been subjected to the patterning process. The material of the metal pattern layer 10 may be a metal material selected from the group consisting of copper (Cu), aluminum (Al), silver (Ag), palladium (Pd), platinum (Pt) and nickel (Ni). The thickness of the metal pattern layer 10 is preferably in the range of 5 μm to 100 μm, more preferably in the range of 10 μm to 50 μm (for example, 18 μm).

The patterning associated with the metal pattern layer 10 may be performed at a point in time before the placing of the layer 10 on the adhesive carrier 10. Alternatively, the patterning of the layer 10 may be performed at a point in time after the placing of the layer 10 on the adhesive carrier 10. In other words, the metal pattern layer 10 on the adhesive carrier 20 can be provided according to the following (1) or (2):

(1) A patterned metal foil, which has been preliminarily patterned, is attached to the adhesive carrier to provide the metal pattern layer on the adhesive carrier; and (2) A metal foil or a metal layer is attached to the adhesive, followed by being subjected to a patterning treatment of the metal foil or the metal layer to provide the metal pattern layer on the adhesive carrier.

The patterning in itself is not particularly limited as long as it is performed in the electronics packaging field. For example, a photolithography process may be performed for the patterning, in which case a formation of resist layer, an exposure to the light and subsequent development, and an etching are sequentially performed. As for the above (1), mechanical machining process such as a punching process may be performed to provide the patterned metal foil.

After the disposing of the metal pattern layer 10, the placement of the electronic component 30 is performed. Namely, as shown in FIG. 6B or 7B, at least one kind of electronic component 30 is placed at such a region of the carrier that the placed component 30 is not overlapped with respect to the metal pattern layer 10. As such, the electronic component 30 is attached to the adhesive carrier 20 such that the placed component 30 and the metal pattern layer 10 are not overlapped with respect to each other on the adhesive carrier 20.

As for the placement of the electronic component 30, the metal pattern layer 10 can be used as a cognition pattern. Namely, at least a part of the metal pattern layer 10 can be used as an alignment mark (see the right-upper illustration in FIGS. 6A-6L). For example, the alignment mark, i.e., the metal pattern layer 10 is used for positioning the electronic component 30 upon the placing of such component 30. This makes it possible to precisely position the electronic component 30, which leads to an achievement of high reliability of the package. The alignment mark in itself may be included in a pattern of the metal pattern layer 10 to serve for the exclusive purpose of the positioning of the electronic component. Alternatively, the pattern of the metal pattern layer, which serves for another purpose, may be used as the alignment mark. An embodiment of the present invention is not limited to the alignment mark serving for the positioning of the electronic component. The alignment mark can also be used for the positioning of other components/parts.

After the placement of the electronic component 30, the sealing resin layer is formed. Namely, as shown in FIG. 6C or 7C, the sealing resin layer 40 is formed on the adhesive carrier 20 such that the metal pattern layer 10 and the electronic component 30 are covered with the sealing resin layer 40, and thereby a precursor 100' of the electronic component-sealing body is produced. Thereafter, as shown in FIG. 6D or 7D, the adhesive carrier 20 is peeled away from the electronic component-sealing body, and thereby the metal pattern layer 10 and an electrode 35 of the electronic component 30 are exposed at the surface of the sealing resin layer 40.

The third embodiment of the present invention makes it possible to provide a suitable detachability of the adhesive carrier 20 due to the presence of the metal pattern layer 10. More specifically, the presence of the metal pattern layer 10 improves an overall detachability of the adhesive carrier 20 with respect to the sealing resin layer 40, the metal pattern layer 10 being positioned locally at the interface between the sealing resin layer 40 and the adhesive carrier 20. This is due to the fact that a contact surface "a" between the metal pattern layer 10 and the adhesive carrier 20 exhibit a more reduced bonding property therebetween than that of a contact surface "b" between the sealing resin layer 40 and the adhesive carrier 20 (see the right-middle illustration in FIGS. 6A-6L). In other words, the local presence of the contact surface "a" capable of exhibiting the reduced bonding property at the interface between the metal pattern layer 10 and the adhesive carrier 20 can improve the detachability of the adhesive carrier 20 with respect to the sealing resin layer 40 as a whole. This means that the metal pattern layer 10, which is positioned locally at the interface between the sealing resin layer 40 and the adhesive carrier 20, serves as "peel-promoting part" or "peel-facilitating part" (i.e., part for promoting the peeling of the adhesive carrier).

As such, the effectively improved detachability between the adhesive carrier 20 and the sealing resin layer 40, which is due to the presence of the metal pattern layer 10, enables the peeling operation of the adhesive carrier 20 to be suitably performed.

It is preferred that the metal pattern layer having a gloss surface is used in order to more suitably perform the peeling of the adhesive carrier. More specifically, it is preferred that the gloss surface 10A of the metal pattern layer 10 is in a contact with the adhesive carrier 20 at a point in time before the peeling of the adhesive carrier 20 (see the right-lower illustration in FIGS. 6A-6L). In the disposing of the metal pattern layer 10, it is preferably disposed on the adhesive carrier 20 such that the gloss surface 10A of the metal pattern layer 10 makes contact with the adhesive carrier 20 (especially the adhesive layer 26). The gloss surface of the metal pattern layer 10 is capable of further reducing the bonding property of the contact surface "a" between the metal pattern layer 10 and the adhesive carrier 20, which leads to the more improved detachability of the adhesive carrier 20 with respect to the sealing resin layer 40.

In addition to or instead of "gloss surface", the metal layer 10 preferably has a roughened surface. In this regard, it is preferred that the metal pattern layer 10 is covered with the sealing resin layer 40 such that the roughened surface 10B of the metal pattern layer 10 is in contact with the sealing resin layer 40 (see the right-lower illustration in FIGS. 6A-6L). This makes it possible to achieve a more suitable detachability of the adhesive carrier 20. It is preferred that the metal pattern layer 10 is disposed on the adhesive carrier 20 such that the roughened surface 10B of the metal pattern layer 10 is an exposed surface (namely, the opposed principal surface of the metal pattern layer is in contact with the adhesive carrier, such surface being opposed to the roughened surface). The sealing resin layer 40 is provided with respect to such exposed roughened surface 10B, and thereby the metal pattern layer 10 is covered with the sealing resin layer 40 such that the roughened surface 10B and the sealing resin layer 40 are in contact with each other. The presence of "roughened surface" of the metal pattern layer can increase a bonding between the metal pattern layer 10 and the sealing resin layer 40, due to the fact that the roughened surface 10B is in a dig state into the sealing resin layer 40. As such, the roughened surface of the metal pattern layer makes it possible to achieve a more suitable detachability of the adhesive carrier 20.

In a particularly preferred embodiment, the metal pattern layer has both of "gloss surface" and "roughened surface". In the case where the metal pattern layer 10 has the gloss surface 10A and the roughened surface 10B, it is preferred that the metal pattern layer 10 is covered with the sealing resin layer 40 such that the gloss surface 10A of the metal pattern layer is in contact with the adhesive carrier 20, and the roughened surface 10B of the metal pattern layer and the sealing resin layer 40 are in bonding state with each other. This makes it possible to achieve both of "improved adhesion between the metal pattern layer 10 and the sealing resin layer 40" and "improved detachability between the sealing resin layer 40 and the adhesive carrier 20".

Figure 8:
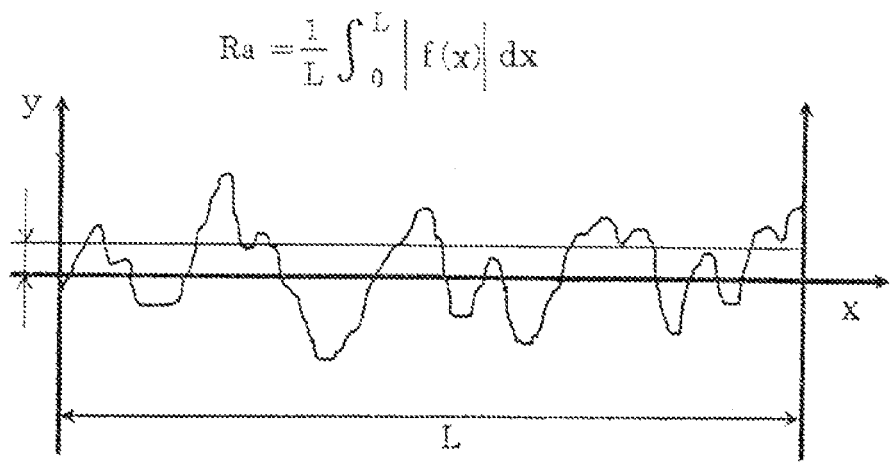
FIG. 8 is a representation of an arithmetic mean roughness "Ra".

The term "roughened surface" as used herein means that a principal surface of the metal pattern layer has a rough surface (i.e., fine concave-convex surface). For example, the term "roughened surface" substantially means that an arithmetic mean roughness Rz of the surface of the metal pattern layer 10 is 5.0 μm or higher, preferably 7.0 μm or higher. The upper limit for the arithmetic mean roughness Rz is not particularly limited, but may be about 10.0 μm or lower. While on the other hand, the term "gloss surface" as used herein means that a principal surface of the metal pattern layer has a smooth surface. For example, the "gloss surface" substantially means that an arithmetic mean roughness Ra of the surface of the metal pattern layer 10 is 0.3 μm or lower, preferably 0.2 μm or lower (as for Rz, Rz is 2.0 μm or lower, preferably 1.0 μm or lower). In other words, the gloss surface of the metal pattern layer has the arithmetic mean roughness Ra of 0 (excluding 0) to 0.3 μm, preferably 0 (excluding 0) to 0.2 μm. The term "arithmetic mean roughness Ra" as used herein substantially means a mean value calculated from the sum of absolute values of the deviations from the average line over the length L of an evaluation section that is set in the roughness curve as shown in FIG. 8 ("roughness curve" in this case corresponds to a section profile of the surface of the metal pattern layer). While on the other hand, the term "arithmetic mean roughness Rz" for the surface of the metal pattern layer substantially is roughness "Rz" defined in JIS B0601. More specifically, the term "arithmetic mean roughness Rz" as used herein means the sum value (μm) of the average of absolute values from the uppermost mountain peak (Yp) to the fifth mountain peak (Yp) and the average of absolute values from the lowermost valley portion (Yv) to the fifth valley portion (Yv), the mountain peak and the valley portion being measured perpendicularly from the average line over the length of an evaluation section that is set in the roughness curve. See JIS B0601:1994.

The subsequent process steps after the provision of the package precursor through the removal of the adhesive carrier, which are similar to those of the first or second embodiment, are performed to provide "step-like metal plating layer" (see FIGS. 6E-6L and FIGS. 7E-7K). After the formation of the step-like metal plating layer 50, the provision of the solder resist layer 60 and the dicing operation are performed similarly to those of the first or second embodiment, and thereby there can be finally obtained the electronic component package 100.

Fourth Embodiment

Figure 9:
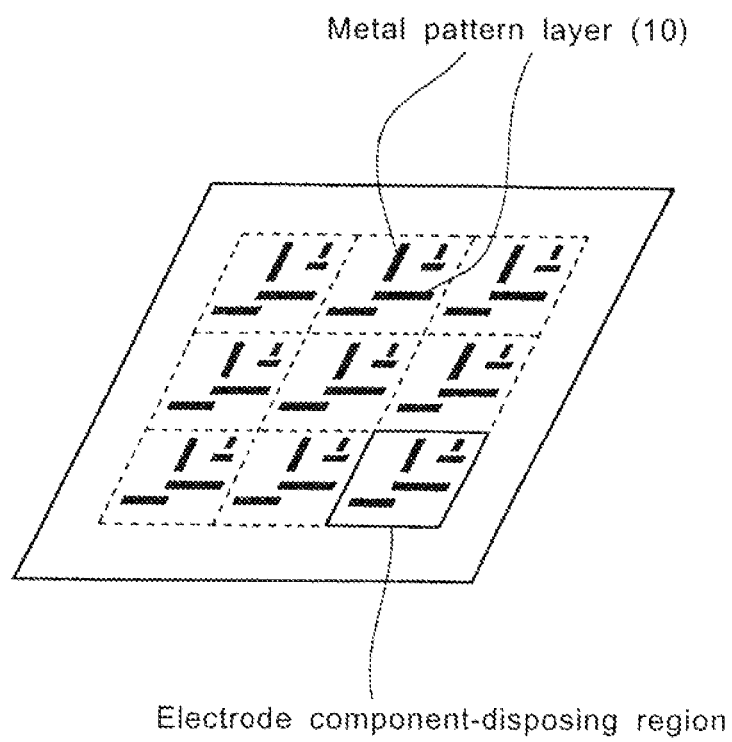
FIG. 9 is a schematic view for a metal pattern layer with a plurality of electronic component-disposing regions included therein.

The fourth embodiment is suitable for a concurrent manufacturing of a plurality of electronic component packages. According to this embodiment of the method of the present invention, a plurality of the electronic component packages can be manufactured concurrently. In this regard, a metal pattern layer with a plurality of openings included therein is preferably used. Specifically, as the metal pattern layer disposed on the adhesive carrier in the provision of the package precursor, the metal pattern layer with a plurality of electronic component-disposing regions included therein is used (see FIG. 9). The metal pattern layer with the plurality of electronic component-disposing regions included therein may be a metal pattern layer having a plurality of spaces for the electronic components, the spaces being in an array form. The electronic components to be used for respective ones of the electronic component packages are placed in the respective ones of the electronic component-disposing regions of metal pattern layer. Namely, each of the electronic components is placed on each of the respective ones of the electronic component-disposing regions, i.e., respective ones of local exposed regions of the adhesive carrier. This makes it possible to produce a precursor of the electronic component packages (in which a plurality of package precursors are integrated with each other) at a time. Thereafter, the sequential dry and wet plating processes are performed, and also the patterning process of at least two of the resulting metal plating layers to form "step-like metal plating layer". Finally, the dicing operation is performed to provide the electronic component packages. Specifically, after the formation of the step-like metal plating layer, the dicing operation is performed to divide the electronic component-disposing regions of the metal pattern layer into respectively-separated regions, which results in a production of the plurality of electronic component packages.

Fifth Embodiment

Figure 10A:
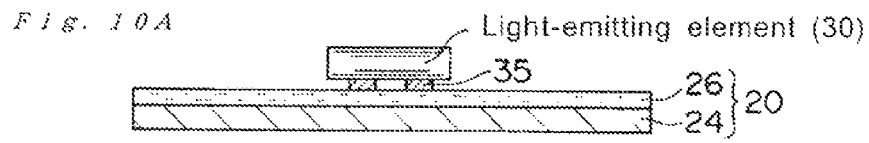
FIGS. 10A to 10H are process-cross sectional views schematically illustrating a manufacturing method of a light-emitting element package according to an embodiment of the present invention.
Figure 10B:
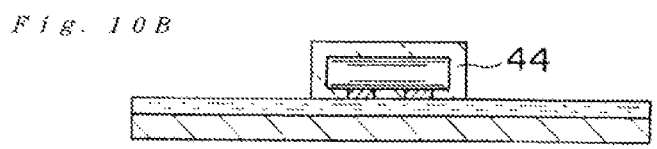
Figure 10C:
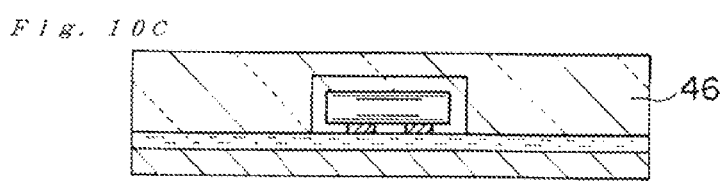
Figure 10D:
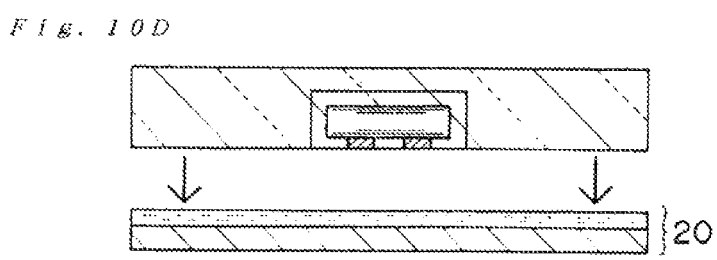
Figure 10E:
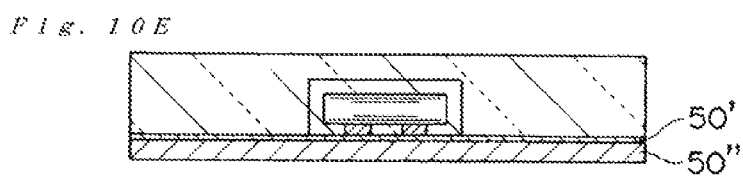
Figure 10F:
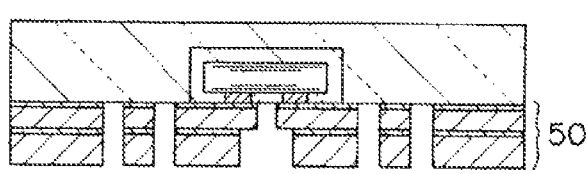
Figure 10G:
Figure 10H:
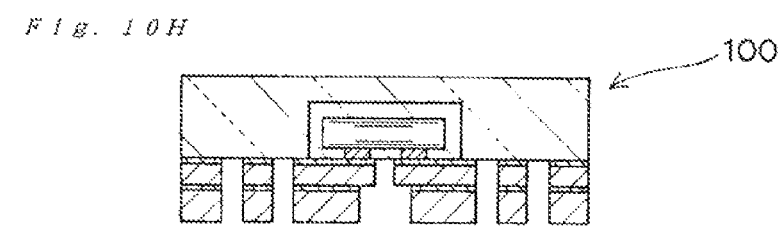

The fifth embodiment is suitable for the manufacturing of a light-emitting package. This embodiment of the method of the present invention also makes it possible to suitably manufacture the light-emitting element package when a light-emitting element is provided as the electronic component (i.e., when the light-emitting element is included as the electronic component to be disposed in the adhesive carrier in the provision step of the package precursor). In the manufacturing of the light-emitting element package, the formations of a fluorescent layer and a transparent resin layer are performed instead of the formation of the sealing resin layer. Specifically, the fluorescent layer 44 is formed on the light-emitting element disposed on the adhesive carrier and thereafter the transparent resin layer 46 is formed to cover the light-emitting element and the fluorescent layer (see FIGS. 10A to 10C). The formations of the fluorescent layer and the transparent resin layer may be similar to those generally used in a conventional LED package manufacturing. The subsequent steps after the formations of the fluorescent layer and the transparent resin layer are the same as those of the first or second embodiment (see FIGS. 10D to 10H). As a result, there can be obtained the desired electronic component package with a desired form of light-emitting element package.

[Electronic Component Package of Present Invention]

An electronic component package according to an embodiment of the present invention will now be described. The electronic component package of the present invention is a package obtained by the above mentioned manufacturing method according to an embodiment of the present invention.

Figure 11:
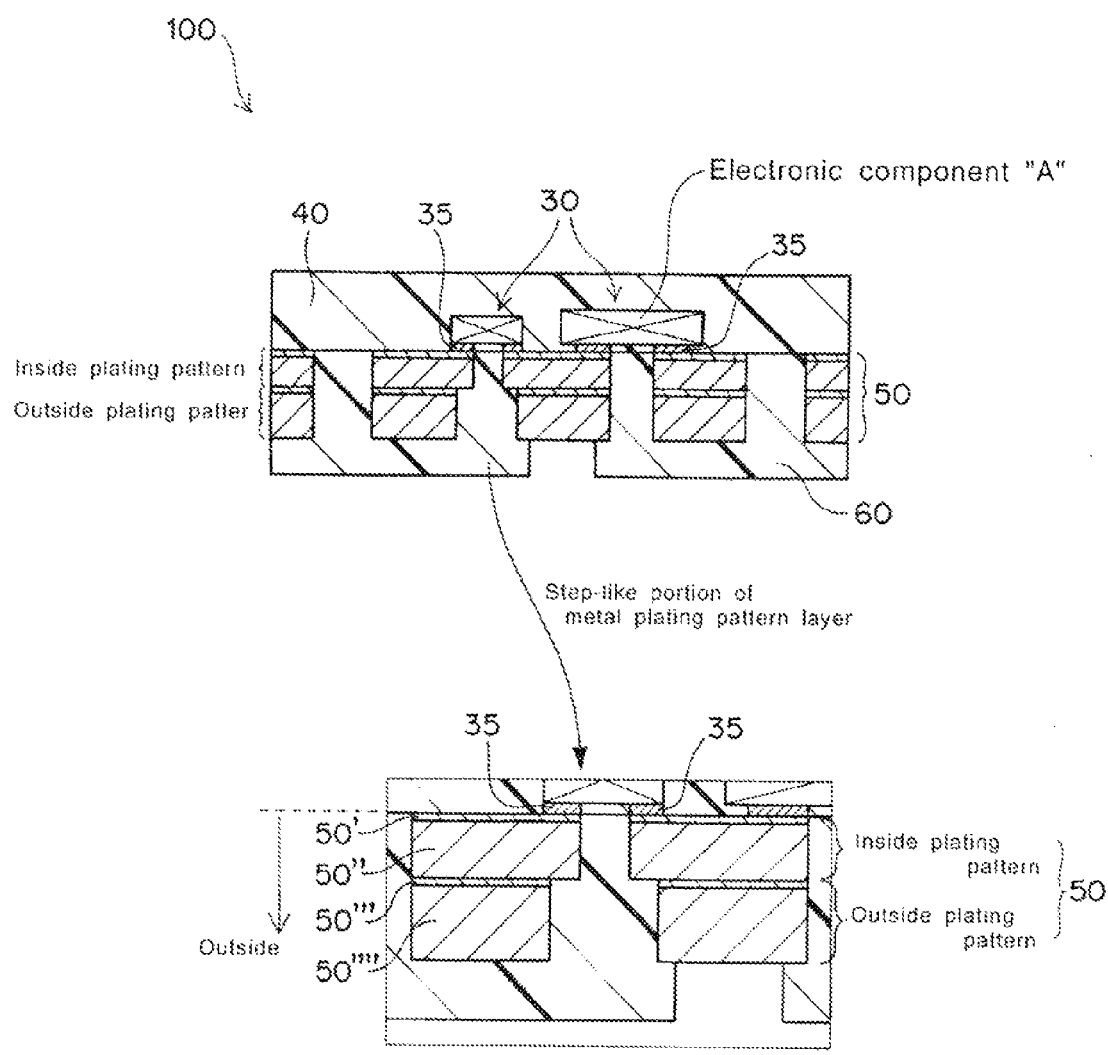
FIG. 11 includes cross-sectional views schematically illustrating a configuration of an electronic component package according to an embodiment of the present invention.

FIG. 11 illustrates a configuration of the electronic component package 100 according to an embodiment of the present invention. As shown in FIG. 11, the electronic component package 100 comprises the sealing resin layer 40, the electronic component 30, and the step-like metal wiring layer 50 in contact with the electronic component.

As shown in FIG. 11, the step-like metal plating pattern layer 50 is composed of an inside plating pattern and an outside plating pattern, the inside plating pattern being located relatively inside, and the outside plating pattern being located relatively outside. The step-like form of the metal plating pattern layer 50 is due to a local exposure of the inside plating pattern from the outside plating pattern.

In the electronic component package according to an embodiment of the present invention, the inside plating pattern is provided such that it is in direct contact with the electronic component (especially, the electrode 35 thereof), and the outside plating pattern is provided on the inside plating pattern, as shown in FIG. 11. As such, the term "inside" of the inside plating pattern substantially means that the patterned layer is located proximally with respect to the exposed surface of the electrode of the electronic component. While on the other hand, the term "outside" of the outside plating pattern substantially that the patterned layer is located distally with respect to the exposed surface of the electrode of the electronic component.

In the electronic component package according to an embodiment of the present invention, the electronic component 30 is in an embedded state in the sealing resin layer 40. In particular, the sealing resin layer 40 has the electronic component 30 embedded therein such that the electronic component 30 is flush with the sealing resin layer 40. Namely, the surface of the electronic component 30 and the surface of the sealing resin layer 40 are on substantially the same plane level. As for the electronic component 30, it is preferred that the electrode 35 of the electronic component 30 is flush with the sealing resin layer 40. This means that the surface of the electrode 35 of the electronic component and the surface of the sealing resin layer 40 are preferably on substantially the same plane level.

Examples of the electronic component 30 in the embedded state in the sealing resin layer 40 may include an IC (e.g., control IC), an inductor, a semiconductor element (e.g., MOS: metal-oxide semiconductor), a capacitor, a power element, a light-emitting element (e.g., LED), a chip resistor, a chip capacitor, a chip varistor, a chip thermistor and a chip laminate filter, a connection terminal and the like. The sealing resin layer 40 comprises an epoxy-based resin or a silicone-based resin, for example. The thickness of the sealing resin layer 40 is preferably in the approximate range of 0.5 mm to 5.0 mm, and more preferably in the approximate range of 1.2 mm to 1.8 mm.

Especially as shown in the enlarged illustration of FIG. 11, the step-like metal plating pattern layer preferably has a four-layered structure. Specifically, the inside plating pattern is composed of the first and second metal plating layers 50', 50'', and the outside plating pattern is composed of the third and fourth metal plating layers 50''', 50''''. Consequently, the step-like metal plating pattern layer preferably has the four-layered structure as a whole. For example, the first metal plating layer 50' is a dry plating layer, and the second metal plating layer 50'' is a wet plating layer in the inside plating pattern, whereas the third metal plating layer 50''' is a dry or wet plating layer, and the fourth metal plating layer 50'''' is a wet plating layer in the outside plating pattern.

In the electronic component package 100 according to an embodiment of the present invention, the dry plating layer preferably comprises at least one kind of metal material selected from the group consisting of Ti (titanium), Cr (chromium), Ni (nickel), W (tungsten), Cu (copper) and alloy (e.g., alloy consisting of at least two kind thereof). While on the other hand, the wet plating layer preferably comprises at least one kind of metal material selected from the group consisting of Ag (silver), Cu (copper), Ni (nickel), Ti (titanium) and Al (aluminum). In particular, the first and third metal plating layers 50', 50''', each of which is provided as the dry plating layer, may comprise the same kind of metal material as each other, and also the second and fourth metal plating layers 50'', 50"", each of which is provided as the wet plating layer, may comprise the same kind of metal material as each other. By way of example, the first and third metal plating layers 50', 50''', each of which is provided as the dry plating layer, may comprise Ti (titanium) as the same metal material, whereas the second and fourth metal plating layers 50", 50"", each of which is provided as the wet plating layer, may comprise the copper as the same metal material. When focusing on "heat releasing" in particular, it is preferred that the material of the thick second and/or fourth metal plating layers 50", 50"" has high thermal conductivity which effectively contributes to the heat releasing of the package. In this regard, the material of the second and/or fourth metal plating layers 50", 50"" preferably comprises the copper (Cu).

The metal plating layer formed by the dry plating process (i.e., the first and third metal plating layers 50', 50''') has a very thin form, and thus it preferably has the thickness of nano-order, whereas the metal plating layer formed by the wet plating process (i.e., the second and/or fourth metal plating layers 50", 50"") has a thick form, and thus it preferably has the thickness of micron-order. Accordingly, in a case where the first metal plating layers 50' is provided as the dry plating layer, the second metal plating layer 50" is provided as the wet plating layer in the inside plating pattern, and also the third metal plating layers 50''' is provided as the dry plating layer, and the fourth metal plating layer 50"" is provided as the wet plating layer in the outside plating pattern, most of the step-like metal plating pattern layer consists of the wet plating layers.

By way of example regarding a preferred embodiment of the present invention, the thickness of the first metal plating layer 50' formed by the dry plating process is preferably in the range of 100 nm to 1500 nm, more preferably in the range of 100 nm to 1000 nm (e.g., two-layered structure of Ti layer with its thickness of 300 nm and Cu layer with its thickness of 1000 nm). While on the other hand, the thickness of the second metal plating layer 50" formed by the wet plating process is preferably in the range of 2 μm to 30 μm, more preferably in the range of 5 μm to 20 μm. The thickness of the third metal plating layer 50''' formed by the dry plating process is preferably in the range of 100 nm to 1500 nm, more preferably in the range of 100 nm to 1000 nm (e.g., Ti layer with its thickness of 300 nm and Cu layer with its thickness of 1000 nm). The thickness of the fourth metal plating layer 50"" formed by the wet plating process is preferably in the range of 14 μm to 500 μm (e.g., 16 μm to 470 μm), more preferably in the range of 30 μm to 230 μm. The total thickness of the second and fourth metal plating layers is in the approximate range of 16 μm to 530 μm, more preferably in the range of 35 μm to 250 μm, and thus the large thickness of the wet plating layers is provided, which results in a suitable provision of the thick metal plating layer as a whole.

Figure 12:
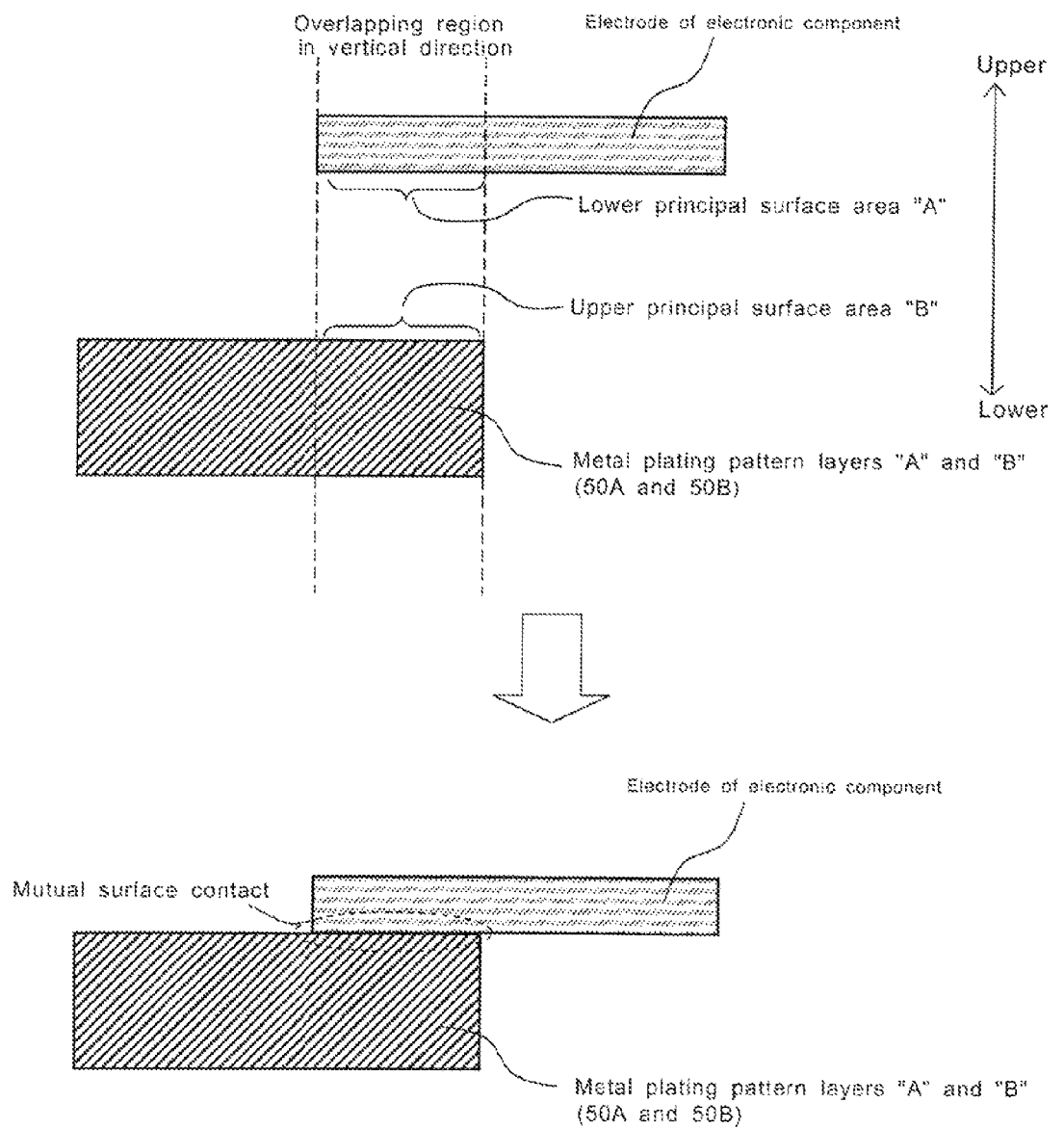
FIG. 12 includes schematic views for explaining "surface contact" (i.e., "direct bonding"/"surface bonding") according to an embodiment of the present invention.

As seen from FIG. 11, the step-like metal plating pattern layer 50 and the electronic component 30, especially the electrode 35 thereof (directly) have mutual surface contact (or direct bonding/surface bonding) with each other in the electronic component package 100 according to an embodiment of the present invention. As such, the metal plating pattern layer 50 and the electronic component 30 are in an electrical connection with each other. Each of the first and third metal plating layers 50', 50''' provided as the dry plating layer is such a thin layer that exhibits the negligible thermal resistance or electrical resistance. It can be thus considered in the present invention that each of the thick second and fourth metal plating layers 50", 50"" provided as the wet plating layer is in direct surface contact (or direct bonding/surface bonding) with the electronic component, especially the electrode 35 thereof. The term "surface contact" (or direct bonding/surface bonding) used herein means an embodiment wherein principal surfaces (upper and lower surfaces) of respective ones of the objects are contacted or bonded with each other, in particular an embodiment wherein overlapping regions between the principal surfaces (upper and lower surfaces) of respective ones of the objects are all contacted with each other. More specifically, the term "surface contact" (or direct bonding/surface bonding) means an embodiment wherein the overlapping regions between "principal surface of the electronic component (i.e., lower principal surface of the electrode thereof, exposed at the sealing resin layer)" and "principal surface (i.e., upper principal surface) of the metal plating pattern layer" are all contacted with each other. In other words, the term "surface contact (or direct bonding/surface bonding)" used herein means an embodiment wherein the mutual overlapping regions of the metal plating pattern layer and the electronic component (especially electrode thereof) are all contacted, which corresponds to an embodiment shown in FIG. 12 where the lower principal surface area "A" and the upper principal surface area "B" are all contacted with each other.

Due to "surface contact" (or direct bonding/surface bonding), the electronic component package 200 according to an embodiment of the present invention is capable of effectively releasing the heat from the electronic component to the outside via the metal plating pattern layer 50. That is, the metal plating pattern layer 50, which is in the surface contact, serves as a heat sink which effectively contributes to the high heat-releasing performance of the package.

Due to the high heat-releasing of the package according to an embodiment of the present invention, a performance, an operating lifetime and the like of the electronic component can be increased, and also degeneration and discoloration of the sealing resin, which are attributed to the heat, can be effectively prevented. Furthermore, due to the "surface contact" (or direct bonding/surface bonding), the electric resistance of the package is more desirable than that of the case of the electrical connection via bump or wire. As such, the package according to an embodiment of the present invention enables a larger electric current to be applied therein. For example, in a case of the light-emitting package (e.g., LED package), the higher luminance can be achieved due to the high heat-releasing and the large electric current.

The metal plating layer has a step like form. The relatively thick portion of the step like form can be located beneath the electronic component, in view of the region located beneath the electronic component especially requiring the heat releasing. While on the other hand, the relatively thin portion of the step like form can be located at the region required for fine wiring of the metal plating. Referring to the illustration of FIG. 11, in a case where the electronic component "A" is a high heat-generation type component such as a semiconductor element (e.g., MOS: Metal-Oxide Semiconductor), a powder element, a light-emitting element (e.g., LED) and an inductor, the relatively thick portion of the step-like metal plating layer is located beneath such electronic component "A", whereas the relatively thin portion of the step-like metal plating layer is located at the other region which requires the fine wiring of the metal plating.

The package according to an embodiment of the present invention may be provided with a resist layer in order to achieve a more preferred form as a package product. In this regard, the electronic component package may comprise the resist layer provided with respect to the metal plating pattern layer. More specifically, it is preferred as shown in FIG. 11 that the solder resist layer 60 is provided such that the metal plating pattern layer is partially covered with the resist layer 60. The resist layer 60 in itself may be the same as that generally provided in the electronics packaging field.

The electronic component package 100 obtained by the manufacturing method according to the above third embodiment of the present invention comprises the metal pattern layer 10. It is preferred in this case that the metal pattern layer 10 is in the embedded state in the sealing resin layer 40 such that the metal pattern layer 10 is flush with the sealing resin layer 40. In particular, the metal pattern layer 10 and the electronic component 30 are in the embedded state in the sealing resin layer 40 such that they are flush with the sealing resin layer 40. Namely, not only the surface of the metal pattern layer 10 and the surface of the sealing resin layer 40 are preferably on substantially the same plane level as each other, but also the surface of the electronic component 30 and the surface of the sealing resin layer 40 are preferably on substantially the same plane as each other.

The metal pattern layer 10 embedded in the sealing resin layer comprises a metal material selected from the group consisting of copper (Cu), silver (Ag), palladium (Pd), platinum (Pt) and nickel (Ni), for example. The thickness of the metal pattern layer 10 is preferably in the range of 5 µm to 100 µm, more preferably in the range of 10 µm to 50 µm (for example, 18 µm). In a case where the metal pattern layer 10 has the gloss surface, it is preferred that the metal pattern layer 10 is in the embedded state in the sealing resin layer 40 such that the gloss surface 10A is flush with the surface of the sealing resin layer 40 (see FIG. 13). In a case where the metal pattern layer 10 has the roughened surface 10B, it is preferred that the metal pattern layer 10 is covered with the sealing resin layer 40 such that the roughened surface 10B is in contact with the sealing resin layer 40 (see FIG. 13). As described above, the term "gloss surface" substantially means that an arithmetic mean roughness Ra of the surface of the metal pattern layer is 0.3 µm or lower, preferably 0.2 µm or lower, whereas the term "roughened surface" substantially means that an arithmetic mean roughness Rz of the surface of the metal pattern layer is 5.0 µm or higher, preferably 7.0 µm or higher.

Figure 13:
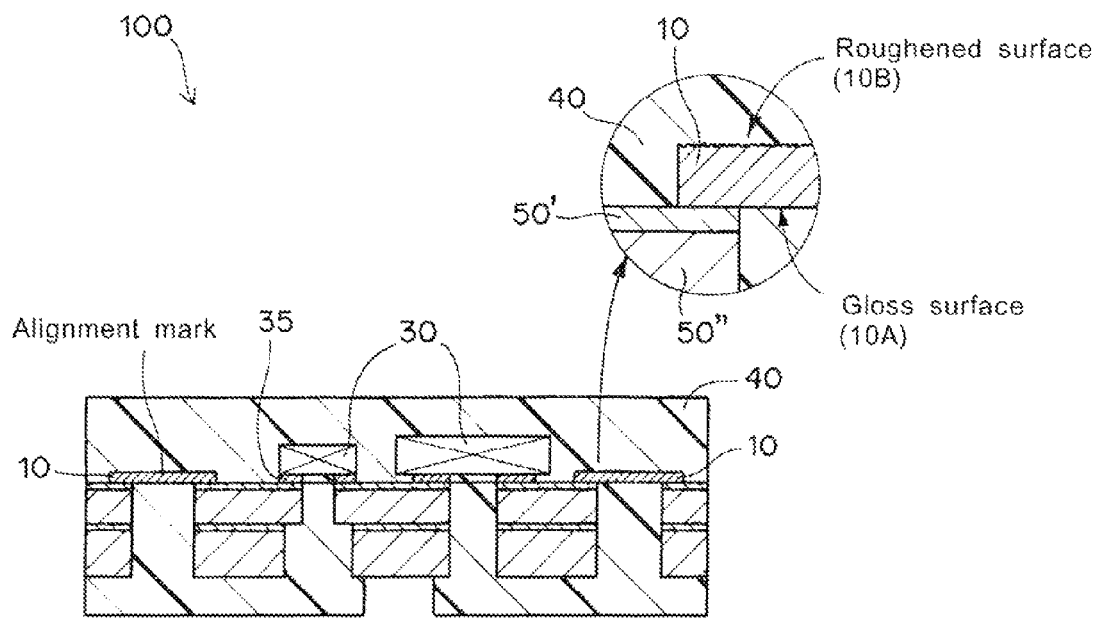
FIG. 13 includes cross-sectional views schematically illustrating a configuration of an electronic component package according to an embodiment of the present invention wherein a metal pattern layer is additionally provided.

In a case where the metal pattern layer 10 is used as the cognition pattern during the manufacturing process of the package, at least a part of the metal pattern layer 10 includes a pattern portion serving as an alignment mark. More specifically, the alignment mark, i.e., a pattern portion 10 of the metal pattern layer is in an embedded in the sealing resin layer 40, as shown in FIG. 13. Preferably, the embedded metal pattern layer serving as the alignment mark is flush with the sealing resin layer 40.

In the package according to an embodiment of the present invention, the metal pattern layer and the electrode of the electronic component are in an electrical connection with each other via at least a part of the metal plating pattern layer. This leads to an provision of an desired wiring form. In other words, a suitable wiring form of the metal plating pattern layer enables the metal pattern layer 10 and the electrode 35 of the electronic component to be in an indirect connection with each other. With this wiring form, the heat from the electronic component, if any, can be suitably released through the metal layer 10.

Figure 14:
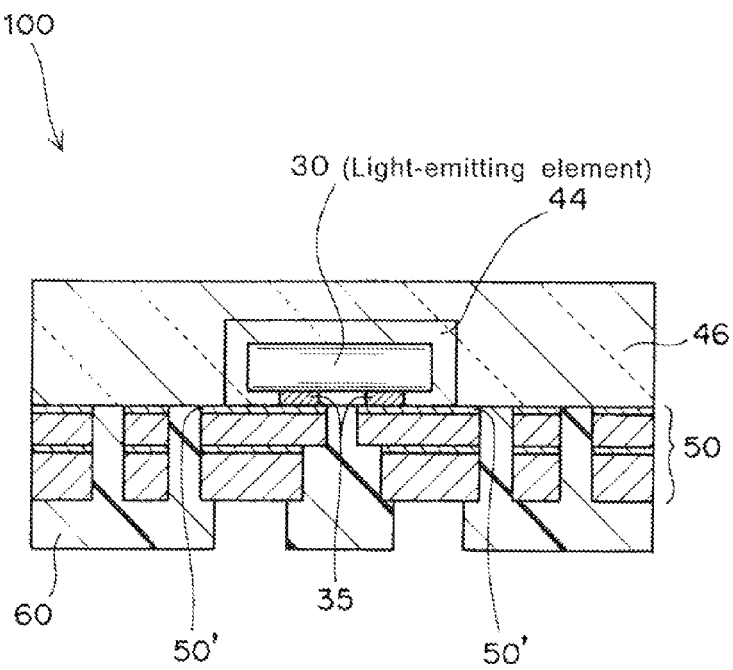
FIG. 14 is a cross-sectional, view schematically illustrating a configuration of an electronic component package (light-emitting element package) according to an embodiment of the present invention.

The electronic component package 100 obtained by the manufacturing method according to the above fifth embodiment of the present invention has such a construction as shown in FIG. 14. Namely, in a case where a light-emitting element is included as the electronic component 30, and thus the electronic component package corresponds to a light-emitting package, a fluorescent layer and a transparent resin layer are preferably provided. Specifically, instead of the sealing resin layer in which the electronic component is embedded, it is preferred as shown in FIG. 14 that the fluorescent layer 44 is provided on the light-emitting element 30, and also the transparent resin layer 46 is provided such that the light-emitting element 30 and the fluorescent layer 44 are covered with the transparent resin layer. This makes it possible to achieve a more preferred form of the electronic component package 100 as the light-emitting element package. The material and thickness for the fluorescent layer and the transparent resin layer may be the same as those conventionally used in the general LED packages. The term "light-emitting element" used herein substantially means an element capable of emitting the light. Examples of the light-emitting element include a light-emitting diode (LED) and an electronic component equipped therewith. As such, the term "light-emitting element" as used herein means not only a "bare chip type LED (i.e., LED chip)" but also a "discrete type light-emitting element wherein a molding of the LED chip is provided". The LED chip may also be a semiconductor laser chip.

In a case where the light-emitting element is included as the electronic component, the first metal plating layer 50' formed by the dry plating process can be suitably used as a reflective layer. In this case, the reflective layer is located beneath the light-emitting element such that they are adjacent to each other. The downward light emitted from the light-emitting element can be reflected by this reflective layer (i.e., the first metal plating layer 50' formed by the dry plating process). As a result, the downward light emitted from the light-emitting element can be eventually reoriented upwardly by the reflective layer. When the high reflectivity is an important consideration, it is preferred that the first metal plating layer 50' is a dry plating layer comprising a metal material selected from the group of Ag (silver) and Al (aluminum).

It should be noted that the present invention as described above includes the following aspects:

The First Aspect:

A method for manufacturing an electronic component package, wherein a package precursor is provided, in which an electronic component is embedded in a sealing resin layer such that an electrode of the electronic component is exposed at a surface of the sealing resin layer, wherein a combination of a formation process of a plurality of metal plating layers and a patterning process of the metal plating layers is performed to form a step-like metal plating layer, the formation process being performed by sequential dry and wet plating processes with respect to the package precursor, the patterning process being performed by a patterning of at least two of the metal plating layers.

The Second Aspect:

The method according to the first aspect, wherein the metal plating layer formed after the preceding patterning for one of the at least two of the metal plating layers, or the metal plating layer provided by the preceding patterning for one of the at least two of the metal plating layers is used as an etching-blocking part for an etching process performed in the succeeding patterning for the other of the at least two of the metal plating layers.

The Third Aspect:

The method according to the first or second aspect, wherein the formation of the step-like metal plating layer comprises the steps of:

(i) performing the dry plating process wholly with respect to a principal surface of the sealing resin layer to form a first metal plating layer, the electrode of the electronic component being exposed at the principal surface of the sealing resin layer;

(ii) performing the wet plating process wholly with respect to a principal surface of the first metal plating layer to form a second metal plating layer;

(iii) subjecting the second metal plating layer to the patterning process to form a metal plating pattern layer "A" configured to locally expose the first metal plating layer;

(iv) performing the dry or wet plating process wholly with respect to the metal plating pattern layer "A" and the locally exposed portion of the first metal plating layer to form a third metal plating layer;

(v) performing the wet plating process wholly with respect to a principal surface of the third metal plating layer to form a fourth metal plating layer;

(vi) subjecting the fourth metal plating layer to the patterning process to form a metal plating pattern layer "B" configured to locally expose the third metal plating layer; and (vii) removing the exposed portion of the third metal plating layer and a local portion of the first metal plating layer, the local portion being located beneath the exposed portion of the third metal plating layer.

The Fourth Aspect:

The method according to the third aspect, wherein the third metal plating layer formed by the step (iv) is used as an etching-blocking part for an etching process performed in the formation of the metal plating pattern layer "B" in the step (vi).

The Fifth Aspect:

The method according to the first or second aspect, wherein the formation of the step-like metal plating layer comprises the steps of:

(i)' performing the dry plating process wholly with respect to a principal surface of the sealing resin layer to form a first metal plating layer, the electrode of the electronic component being exposed at the principal surface of the sealing resin layer;

(ii)' performing the wet plating process wholly with respect to a principal surface of the first metal plating layer to form a second metal plating layer;

(iii)' performing the dry or wet plating process wholly with respect to a principal surface of the second metal plating layer to form a third metal plating layer;

(iv)' subjecting the third metal plating layer to the patterning process to form a metal plating pattern layer "A'" configured to locally expose the second metal plating layer:

(v)' performing the wet plating process wholly with respect to the metal plating pattern layer "A'" and the locally exposed portion of the second metal plating layer to form a fourth metal plating layer;

(vi)' subjecting the fourth metal plating layer to the patterning process to form a metal plating pattern layer "B'" configured to locally expose the first and third metal plating layers; and (vii)' removing the exposed portion of the first and third metal plating layers.

The Sixth Aspect:

The method according to the fifth aspect, wherein the metal plating pattern layer "A'" of the third metal plating layer, the layer "A'" being formed by the step (iv)', is used as an etching-blocking part for an etching process performed in the formation of the metal plating pattern layer "B'" in the step (vi)'.

The Seventh Aspect:

The method according to any one of the third to sixth aspects, wherein an etchant is used in the removing step (vii), the etchant being capable of dissolving and removing the first and third metal plating layers, while being not capable of dissolving and removing the second and fourth metal plating layers.

The Eighth Aspect:

The method according to any one of the first to seventh aspects, wherein a sputtering is performed as the dry plating process, whereas an electroplating is performed as the wet plating process.

The Ninth Aspect:

The method according to any one of the first to eighth aspects, wherein each of the first and third metal plating layers is formed by the dry plating process to have a thickness of 100 nm to 1000 nm, and wherein the second metal plating layer is formed by the wet plating process to have a thickness of 5 μm to 20 μm, and the fourth metal plating layer is formed by the wet plating process to have a thickness of 14 μm to 500 μm.

The Tenth Aspect:

The method according to any one of the first to ninth aspects, wherein the package precursor is provided, in which the electronic component is embedded in the sealing resin layer such that a surface of the electrode of the electronic component is flush with the sealing resin layer.

The Eleventh Aspect:

The method according to the tenth aspect, wherein the package precursor further has a metal pattern layer embedded in the sealing resin layer, in addition to the electronic component, such that a principal surface of the metal pattern layer, the surface of the electrode of the electronic component and the sealing resin layer are flush with each other in the package precursor.

The Twelfth Aspect:

The method according to any one of the first to eleventh aspects, wherein the provision of the package precursor comprises the steps of:

(a) placing the electronic component on an adhesive carrier such that the electronic component is attached to the adhesive carrier;

(b) forming the sealing resin layer on the adhesive carrier such that the electronic component is covered with the sealing resin layer; and (c) peeling away the adhesive carrier from the sealing resin layer, and thereby the electrode of the electronic component is exposed at the surface of the sealing resin layer.

The Thirteenth Aspect:

The method according to the twelfth aspect when appendant to the eleventh aspect, wherein, in the step (a), the metal pattern layer is disposed on the adhesive carrier such that the metal pattern layer is attached to the adhesive carrier, and thereafter the electronic component is placed on the adhesive carrier such that the placed electronic component is not overlapped with the metal pattern layer.

The Fourteenth Aspect:

The method according to the thirteenth aspect, wherein the metal pattern layer has a gloss surface; and the gloss surface of the metal pattern layer is in contact with the adhesive carrier at a point in time before the peeling of the adhesive carrier.

The Fifteenth Aspect:

The method according to the thirteenth or fourteenth aspect, wherein the metal pattern layer has a roughened surface, and the metal pattern layer is covered with the sealing resin layer such that the roughened surface of the metal pattern layer is in contact with the sealing resin layer.

The Sixteenth Aspect:

The method according to any one of the twelfth to fifteenth aspects, wherein a light-emitting element is included as the electronic component to be placed in the step (a), and instead of forming the sealing resin layer in the step (b), a fluorescent layer is formed on the light-emitting element, and thereafter a transparent resin layer is formed to cover the light-emitting element and the fluorescent layer.

The Seventeenth Aspect:

An electronic component package, comprising:

a sealing resin layer;

an electronic component buried in the sealing resin layer; and a step-like metal plating pattern layer in electrical connection with the electronic component, wherein step-like metal plating pattern layer is composed of an inside plating pattern and an outside plating pattern, the inside plating pattern being located relatively inside, and the outside plating pattern being located relatively outside, and wherein the step-like form of the metal plating pattern layer is due to an exposure of the inside plating pattern from the outside plating pattern.

The Eighteenth Aspect:

The electronic component package according to the seventeenth aspect, wherein the inside plating pattern is composed of first and second metal plating layers, and the outside plating pattern is composed of third and fourth metal plating layers, and thereby the step-like metal plating pattern layer has a four-layered structure as a whole.

The Nineteenth Aspect:

The electronic component package according to the eighteenth aspect, wherein the first metal plating layer is a dry plating layer, and the second metal plating layer is a wet plating layer in the inside plating pattern, and wherein the third metal plating layer is a dry or wet plating layer, and the fourth metal plating layer is a wet plating layer in the outside plating pattern.

The Twentieth Aspect:

The electronic component package according to the nineteenth aspect, wherein the first and third metal plating layers, each of which is provided as the dry plating layer, comprise the same kind of metal material as each other, and wherein the second and fourth metal plating layers, each of which is provided as the wet plating layer, comprise the same kind of metal material as each other.

The Twenty-First Aspect:

The electronic component package according to the twentieth aspect, wherein the dry plating layer comprises at least one kind of a material selected from a group consisting of titanium, chrome, nickel, tungsten, copper and alloy, and the wet plating layer comprises at least one kind of a material selected from a group consisting of silver, copper, nickel, titanium and aluminum.

The Twenty-Second Aspect:

The electronic component package according to any one of the eighteenth to twenty-first aspects, wherein each of the first and third metal plating layers has a thickness of 100 nm to 1000 nm, the second metal plating layer has a thickness of 5 μm to 20 μm, and the fourth metal plating layer has a thickness of 14 μm to 500 μm.

The Twenty-Third Aspect:

The electronic component package according to any one of the seventeenth to twenty-second aspects, wherein the electronic component is buried in the sealing resin layer such that an electrode of the electronic component is flush with the sealing resin layer.

The Twenty-Fourth Aspect:

The electronic component package according to any one of the seventeenth to twenty-third aspects, further comprising a metal pattern layer buried in the sealing resin layer, wherein the metal pattern layer is buried in the sealing resin layer such that the metal pattern layer is flush with the sealing resin layer.

The Twenty-Fifth Aspect:

The electronic component package according to the twenty-fourth aspect, wherein at least a part of the step-like metal plating pattern layer and/or the metal pattern layer serves as a heat-releasing part of the electronic component package.

The Twenty-Sixth Aspect:

The electronic component package according to any one of the seventeenth to twenty-fifth aspects, wherein a light-emitting element is provided as the electronic component, and instead of the sealing resin layer, a fluorescent layer is provided on the light-emitting element, and also a transparent resin layer is provided such that the light-emitting element and the fluorescent layer are covered with the transparent resin layer.

While some embodiments of the present invention have been hereinbefore described, they are merely the typical embodiments. It will be readily appreciated by those skilled in the art that the present invention is not limited to the above embodiments, and that various modifications are possible without departing from the scope of the present invention.

For example, the peeled adhesive carrier, which has been already removed from the precursor, may be re-used. That is, the used adhesive carrier can be used for the manufacturing of another electronic component package at a later stage.

EXAMPLES

The electronic component package was manufactured according to an embodiment of the present invention.

(Material for Package)

"Adhesive carrier (i.e., adhesive film)" used for the manufacturing of the package were as follows.

| | |
|---|---|
| Adhesive carrier (Adhesive film) | Single-faced adhesive tape (adhesive layer: about 15 um and polyester film: about 200 um) about 200 mm × about 200 mm |
| Sealing resin layer | Liquid epoxy resin |
| Copper foil (metal pattern layer/ copper foil for cognizing component) | Copper foil (about 18 um) with gloss surface on one face and roughened surface on the other face, i.e., resin side face |

The electronic component package was obtained by the following processes.

| | |
|---|---|
| Mounting | Mounting of electronic component |
| Sealing resin preparation | Metering of predetermined amount of liquid epoxy rein, and then filling die therewith |
| Vacuum heat press | Charging die in heat press (heated at about 50° C.), and decompression into a pressure of about -0.1 MPa by vacuum pump, followed by holding it for about five minutes. Then, heating up to about 120° C. and pressurizing up to about 0.1 MPa, followed by holding it for about 15 minutes. |
| Demolding | Removal of die from heat press, followed by cooling thereof. Then, sample was taken out from die. |
| After-cure | Complete curing by dryer (about 150° C.) for about 60 minutes (in the air). |
| Sputtering (Ti/Cu) | Providing precursor in sputtering apparatus. Then, reverse sputtering plus Ti sputtering (about 200 Å), and Cu sputtering (about 800 Å) |

| -continued | |
|---|---|
| Electrolytic Cu plating | Electrolytic Cu plating to provide thickness (up to about 10 um) of plating layer |
| Liquid resist formation | Application of liquid resist ink by spin-coater. Drying until no tack is provided. |
| Lithographic exposure | Exposure of liquid resist layer to UV light via patterned mask, with shape of wiring being locally exposed. |
| Development | Development of liquid resist with alkaline developer. |
| Etching | Etching of Cu with ferric chloride solution. |
| Removal | Removal of liquid resist with alkaline stripping liquid |
| Sputtering (Ti) | Providing precursor in sputtering apparatus. Then, reverse sputtering plus Ti sputtering (about 200 A) |
| Electrolytic Cu plating | Electrolytic Cu plating to provide thickness (up to about 100 um) of plating layer |
| Liquid resist formation | Application of liquid resist ink by spin-coater. Drying until no tack is provided. |
| Lithographic exposure | Exposure of liquid resist layer to UV light via patterned mask, with shape of wiring being locally exposed. |
| Development | Development of liquid resist with alkaline developer. |
| Etching | Etching of Cu with ferric chloride solution. |
| Removal | Removal of liquid resist with alkaline stripping liquid |
| Etching | Etching of Ti |
| Soder resist application | Screen printing of photosensitive solder resist print ink. Heat treatment until no adhesiveness is provided. |
| Lithographic exposure | Exposure of resist to UV light via patterned mask |
| Development | Development of solder resist with alkaline developer. |
| Curing | Complete cure of solder by heat treatment. |
| Dicing | Cut into pieces with desired size by blade (with its width dimension of about 0.2 mm) of dicer device. |
| Stamping | Stamping of serial number on surface of sealing resin. |
| Inspection | Examining of electrical function. |
| Completion | Completion |

As a result of the above processes, there was able to be obtained the package with "substrate-less", "wire bonding-less/bump-less", "solder material-less". It was confirmed that the bump-less thick metal plating layer with a form of "step-like" had been formed with respect to "exposed surface of electrode of electronic component", and that the local thick part of the step-like metal plating pattern layer were capable of serving as a heat sink, whereas the local thin part of the step-like metal plating pattern layer were capable of serving as a fine line.

INDUSTRIAL APPLICABILITY

The present invention can be suitably used in various applications of electronics packaging field. For example, the present invention can be suitably available in an electric source package (e.g., POL converter such as voltage step down DC-DC converter), a LED package, a module with a built-in component.

CROSS REFERENCE TO RELATED PATENT APPLICATION

The present application claims the right of priority of Japan patent application No. 2012-279842 (filing date: Dec. 21, 2012, title of the invention: ELECTRONIC COMPONENT PACKAGE AND METHOD FOR MANUFACTURING THE SAME), the whole contents of which are incorporated herein by reference.

EXPLANATION OF REFERENCE NUMERALS

10 Metal pattern layer
10A Gloss surface of metal pattern layer
10B Roughened surface of metal pattern layer
20 Adhesive carrier
24 Supporting base of adhesive carrier
26 Adhesive layer of adhesive carrier
30 Electronic component
35 Electrode of electronic component
40 Sealing resin layer
44 Fluorescent layer
46 Transparent resin layer
50 Metal plating layer
50' First metal plating layer
50" Second metal plating layer
50''' Third metal plating layer
50'''' Fourth metal plating layer
60 Resist layer
100' Precursor of electronic component package
100 Electronic component package
P Region positioned outside with respect to "recessed portion of third metal plating layer, locally formed due to bended form of second metal plating layer"
Q Local portion of first metal plating layer, located beneath exposed portion of third metal plating layer
R Spaced portion of metal plating pattern layer A'
S Region positioned outside with respect to spaced region "R" of metal plating pattern layer A'

The invention claimed is:

1. A method for manufacturing an electronic component package,
wherein a package precursor is provided, in which an electronic component is embedded in a sealing resin layer such that an electrode of the electronic component is exposed at a surface of the sealing resin layer,
wherein a combination of a formation process of a plurality of metal plating layers and a patterning process of the metal plating layers is provided to form a step-like metal plating layer, the formation process being performed by sequential dry and wet plating processes with respect to the package precursor, the patterning process being performed by a patterning of at least two of the metal plating layers, and
wherein the formation of the step-like metal plating layer comprises the steps of:
(i) performing the dry plating process wholly with respect to a principal surface of the sealing resin layer to form a first metal plating layer, the electrode of the electronic component being exposed at the principal surface of the sealing resin layer;
(ii) performing the wet plating process wholly with respect to a principal surface of the first metal plating layer to form a second metal plating layer;
(iii) subjecting the second metal plating layer to the patterning process to form a metal plating pattern layer "A" configured to locally expose the first metal plating layer;
(iv) performing the dry or wet plating process wholly with respect to the metal plating pattern layer "A" and a locally exposed portion of the first metal plating layer to form a third metal plating layer;
(v) performing the wet plating process wholly with respect to a principal surface of the third metal plating layer to form a fourth metal plating layer;
(vi) subjecting the fourth metal plating layer to the patterning process to form a metal plating pattern layer "B" configured to locally expose the third metal plating layer; and
(vii) removing an exposed portion of the third metal plating layer and a local portion of the first metal plating layer, the local portion being located beneath the exposed portion of the third metal plating layer.

2. The method according to claim 1, wherein the third metal plating layer formed by the step (iv) is used as an etching-blocking part for an etching process performed in the formation of the metal plating pattern layer "B" in the step (vi).

3. The method according to claim 1, wherein an etchant is used in the removing step (vii), the etchant being capable of dissolving and removing the first and third metal plating layers, while being incapable of dissolving and removing the second and fourth metal plating layers.

4. The method according to claim 1, wherein a sputtering is performed as the dry plating process, whereas an electroplating is performed as the wet plating process.

5. The method according to claim 1, wherein each of the first and third metal plating layers is formed by the dry plating process to have a thickness of 100 nm to 1000 nm, and
wherein the second metal plating layer is formed by the wet plating process to have a thickness of 5 μm to 20 μm, and the fourth metal plating layer is formed by the wet plating process to have a thickness of 14 μm to 500 μm.

6. The method according to claim 1, wherein the package precursor is provided, in which the electronic component is embedded in the sealing resin layer such that a surface of the electrode of the electronic component is flush with the sealing resin layer.

7. The method according to claim 6, wherein the package precursor further has a metal pattern layer embedded in the sealing resin layer, in addition to the electronic component, such that a principal surface of the metal pattern layer, the surface of the electrode of the electronic component and the sealing resin layer are flush with each other in the package precursor.

8. The method according to claim 1, wherein the provision of the package precursor comprises the steps of:
(a) placing the electronic component on an adhesive carrier such that the electronic component is attached to the adhesive carrier;
(b) forming the sealing resin layer on the adhesive carrier such that the electronic component is covered with the sealing resin layer; and
(c) peeling away the adhesive carrier from the sealing resin layer, and thereby exposing the electrode of the electronic component at the surface of the sealing resin layer.

9. The method according to claim 8, wherein the package precursor further has a metal pattern layer embedded in the sealing resin layer, in addition to the electronic component, such that a principal surface of the metal pattern layer, the surface of the electrode of the electronic component and the sealing resin layer are flush with each other in the package precursor, and
wherein, in the step (a), the metal pattern layer is disposed on the adhesive carrier such that the metal pattern layer is attached to the adhesive carrier, and thereafter the electronic component is placed on the adhesive carrier such that the placed electronic component does not overlap with the metal pattern layer.

10. The method according to claim 9, wherein the metal pattern layer has a gloss surface, and
wherein the gloss surface of the metal pattern layer is in contact with the adhesive carrier at a point in time before the peeling of the adhesive carrier.

11. The method according to claim 9, wherein the metal pattern layer has a roughened surface, and
wherein the metal pattern layer is covered with the sealing resin layer such that the roughened surface of the metal pattern layer is in contact with the sealing resin layer.

12. The method according to claim 8, wherein a light-emitting element is included as the electronic component to be placed in the step (a), and
wherein, as the forming of the sealing resin layer in the step (b), a fluorescent layer is formed on the light-emitting element, and thereafter a transparent resin layer is formed to cover the light-emitting element and the fluorescent layer.

13. A method for manufacturing an electronic component package,
wherein a package precursor is provided, in which an electronic component is embedded in a sealing resin layer such that an electrode of the electronic component is exposed at a surface of the sealing resin layer,
wherein a combination of a formation process of a plurality of metal plating layers and a patterning process of the metal plating layers is provided to form a step-like metal plating layer, the formation process being performed by sequential dry and wet plating processes with respect to the package precursor, the patterning process being performed by a patterning of at least two of the metal plating layers, and
wherein the formation of the step-like metal plating layer comprises the steps of:
(i)' performing the dry plating process wholly with respect to a principal surface of the sealing resin layer to form a first metal plating layer, the electrode of the electronic component being exposed at the principal surface of the sealing resin layer;
(ii)' performing the wet plating process wholly with respect to a principal surface of the first metal plating layer to form a second metal plating layer;
(iii)' performing the dry or wet plating process wholly with respect to a principal surface of the second metal plating layer to form a third metal plating layer;
(iv)' subjecting the third metal plating layer to the patterning process to form a metal plating pattern layer "A'" configured to locally expose the second metal plating layer;
(v)' performing the wet plating process wholly with respect to the metal plating pattern layer "A'" and a locally exposed portion of the second metal plating layer to form a fourth metal plating layer;
(vi)' subjecting the fourth metal plating layer to the patterning process to form a metal plating pattern layer "B'" configured to locally expose the first and third metal plating layers; and
(vii)' removing an exposed portion of the first and third metal plating layers.

14. The method according to claim 13, wherein the metal plating pattern layer "A'" of the third metal plating layer, the metal plating pattern layer "A'" being formed by the step (iv)', is used as an etching-blocking part for an etching process performed in the formation of the metal plating pattern layer "B'" in the step (vi)'.

15. The method according to claim 13, wherein a sputtering is performed as the dry plating process, whereas an electroplating is performed as the wet plating process.

16. The method according to claim 13, wherein each of the first and third metal plating layers is formed by the dry plating process to have a thickness of 100 nm to 1000 nm, and
wherein the second metal plating layer is formed by the wet plating process to have a thickness of 5 μm to 20 μm, and the fourth metal plating layer is formed by the wet plating process to have a thickness of 14 μm to 500 μm.

17. The method according to claim 13, wherein the package precursor is provided, in which the electronic component is embedded in the sealing resin layer such that a surface of the electrode of the electronic component is flush with the sealing resin layer.

18. The method according to claim 17, wherein the package precursor further has a metal pattern layer embedded in the sealing resin layer, in addition to the electronic component, such that a principal surface of the metal pattern layer, the surface of the electrode of the electronic component and the sealing resin layer are flush with each other in the package precursor.

19. The method according to claim 13, wherein the provision of the package precursor comprises the steps of:
(a) placing the electronic component on an adhesive carrier such that the electronic component is attached to the adhesive carrier;
(b) forming the sealing resin layer on the adhesive carrier such that the electronic component is covered with the sealing resin layer; and
(c) peeling away the adhesive carrier from the sealing resin layer, and thereby exposing the electrode of the electronic component at the surface of the sealing resin layer.

20. The method according to claim 19, wherein the package precursor further has a metal pattern layer embedded in the sealing resin layer, in addition to the electronic component, such that a principal surface of the metal pattern layer, the surface of the electrode of the electronic component and the sealing resin layer are flush with each other in the package precursor, and
wherein, in the step (a), the metal pattern layer is disposed on the adhesive carrier such that the metal pattern layer is attached to the adhesive carrier, and thereafter the electronic component is placed on the adhesive carrier such that the placed electronic component does not overlap with the metal pattern layer.

21. The method according to claim 20, wherein the metal pattern layer has a gloss surface, and
wherein the gloss surface of the metal pattern layer is in contact with the adhesive carrier at a point in time before the peeling away of the adhesive carrier.

22. The method according to claim 8, wherein the metal pattern layer has a roughened surface, and
wherein the metal pattern layer is covered with the sealing resin layer such that the roughened surface of the metal pattern layer is in contact with the sealing resin layer.

23. The method according to claim 19, wherein a light-emitting element is included as the electronic component to be placed in the step (a), and
wherein, as the forming of the sealing resin layer in the step (b), a fluorescent layer is formed on the light-emitting element, and thereafter a transparent resin layer is formed to cover the light-emitting element and the fluorescent layer.

24. An electronic component package, comprising:
a sealing resin layer;
an electronic component buried in the sealing resin layer; and
a step-like metal plating pattern layer in electrical connection with the electronic component,
wherein the step-like metal plating pattern layer is composed of an inside plating pattern and an outside plating pattern, the inside plating pattern being located relatively inside, and the outside plating pattern being located relatively outside,
wherein a step-like form of the metal plating pattern layer is due to an exposure of the inside plating pattern from the outside plating pattern,
wherein the inside plating pattern is composed of first and second metal plating layers, and the outside plating pattern is composed of third and fourth metal plating layers, and thereby the step-like metal plating pattern layer has a four-layered structure as a whole, and
wherein each of the first and third metal plating layers has a thickness of 100 nm to 1000 nm, the second metal plating layer has a thickness of 5 μm to 20 μm, and the fourth metal plating layer has a thickness of 14 μm to 500 μm.

25. The electronic component package according to claim 24, wherein the first metal plating layer is a dry plating layer, and the second metal plating layer is a wet plating layer in the inside plating pattern, and
wherein the third metal plating layer is a dry or wet plating layer, and the fourth metal plating layer is a wet plating layer in the outside plating pattern.

26. The electronic component package according to claim 25, wherein the first and third metal plating layers, each of which is provided as the dry plating layer, comprise the same kind of metal material as each other, and
wherein the second and fourth metal plating layers, each of which is provided as the wet plating layer, comprise the same kind of metal material as each other.

27. The electronic component package according to claim 26, wherein the dry plating layer comprises at least one kind of a material selected from the group consisting of titanium, chrome, nickel, tungsten, copper and alloy, and
wherein the wet plating layer comprises at least one kind of a material selected from the group consisting of silver, copper, nickel, titanium and aluminum.

28. The electronic component package according to claim 24, wherein the electronic component is buried in the sealing resin layer such that an electrode of the electronic component is flush with the sealing resin layer.

29. The electronic component package according to claim 24, further comprising a metal pattern layer buried in the sealing resin layer,
wherein the metal pattern layer is buried in the sealing resin layer such that the metal pattern layer is flush with the sealing resin layer.

30. The electronic component package according to claim 29, wherein at least a part of the step-like metal plating pattern layer and/or the metal pattern layer serves as a heat-releasing part of the electronic component package.

31. The electronic component package according to claim 24, wherein a light-emitting element is provided as the electronic component, and
wherein, as the sealing resin layer, a fluorescent layer is provided on the light-emitting element, and also a transparent resin layer is provided such that the light-emitting element and the fluorescent layer are covered with the transparent resin layer.

* * * * *